US010084455B2

(12) United States Patent
Pappalardo et al.

(10) Patent No.: US 10,084,455 B2
(45) Date of Patent: Sep. 25, 2018

(54) SYSTEM RELATED INTEGRATED CIRCUIT, APPARATUS AND METHOD

(71) Applicant: STMicroelectronics S.r.l., Agrate Brianza (IT)

(72) Inventors: Francesco Pappalardo, Paterno (IT); Giuseppe Notarangelo, Gravina di Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/607,588

(22) Filed: May 29, 2017

(65) Prior Publication Data

US 2018/0159538 A1 Jun. 7, 2018

(30) Foreign Application Priority Data

Dec. 1, 2016 (IT) ........................ 102016000122044

(51) Int. Cl.
*G05B 11/01* (2006.01)
*H03K 19/21* (2006.01)

(52) U.S. Cl.
CPC ......... *H03K 19/21* (2013.01); *G08C 2201/91* (2013.01); *H03K 2217/94021* (2013.01)

(58) Field of Classification Search
None
See application file for complete search history.

(56) References Cited

U.S. PATENT DOCUMENTS 4,471,480 A 9/1984 Haussmann et al.
5,761,483 A * 6/1998 Trimberger ......... G06F 17/5054 326/40
6,044,412 A 3/2000 Evoy
7,656,190 B2 * 2/2010 Dorairaj ............... G11C 7/1006 326/38
7,710,754 B2 5/2010 Kao

OTHER PUBLICATIONS electronicshub.org, "Multiplexer (MUX) and Multiplexing", Jul. 20, 2015, 17 pages, Retrieved from http://www.electronicshub.org/multiplexerandmultiplexing/.
Texas Instruments Incorporated, "SN54ALS257A, SN54ALS258A, SN74ALS257A, SN74ALS258A, SN74AS257, SN74AS258 Quadruple 2-Line to 1-Line Data Selectors/Multiplexers With 3-State Outputs", SDAS124C, Apr. 1982—Revised Aug. 1996, 20 pages.
Hsieh, Ming-Ta et al., "Architectures for Multi-Gigabit Wire-Linked Clock and Data Recovery", IEEE Circuits and Systems Magazine, Dec. 2008, pp. 45-57.

* cited by examiner

*Primary Examiner* — K. Wong
(74) *Attorney, Agent, or Firm* — Slater Matsil, LLP

(57) ABSTRACT

A system includes a processing circuit and a circuit configured to output a given number N of bits of configuration information to be used by the processing circuit. The circuit includes a non-volatile programmable memory configured to output a first group of N bits, N terminals for receiving a second group of N bits, and N logic gates. A first input terminal of each logic gate is connected to a respective bit of output from the non-volatile programmable memory and wherein a second input terminal of each logic gate is connected to a respective terminal of the N terminals.

25 Claims, 14 Drawing Sheets

SYSTEM RELATED INTEGRATED CIRCUIT, APPARATUS AND METHOD

CROSS-REFERENCE TO RELATED APPLICATIONS

This application claims priority to Italian Patent Application No. 102016000122044, filed on Dec. 1, 2016, which application is hereby incorporated herein by reference.

TECHNICAL FIELD

Embodiments of the present disclosure relate to techniques for setting configuration information, such as the reference address of a receiver circuit.

BACKGROUND

FIG. 1 shows a generic communication system comprising a transmitter device 1 and a receiver device 2. Specifically, in the example considered, the transmitter device 1 may transmit data to the receiver device 2 over a communication channel 3, which generally may be a cable, including also optical fibers, or a wireless communication channel. Generally, at the physical layer, the communication between the transmitter device 1 and the receiver device 2 may also use a plurality of parallel physical communication channels, e.g., a plurality of communication lines, and/or the communication may be unidirectional or bidirectional according to a given transmission protocol.

In regard to this, a telecommunication protocol is identified by a system of rules that allows two or more entities of a communication system to communicate between them in order to transmit data via a suitable variation of one or more physical quantities.

For example, FIG. 2 shows an example, wherein the transmitter device 1 is a remote control. Specifically, in the example considered, the remote control 1 comprises a wireless transmitter 10, such as an infrared (IR) photodiode. Similarly, the receiver device 2 may be an apparatus, such as a television, DVD-player, etc., comprising a wireless receiver 20, such as an IR receiver diode. Accordingly, in the example considered, the remote control 1 may transmit input data DI to the apparatus 2 by means of the wireless transmitter 10 and the wireless receiver 20. For example, the data DI may indicate a button having been pressed on the remote control 1.

Specifically, as shown in FIG. 3, a transmitter device 1 usually comprises a transmitter circuit 12 configured to drive the transmitter 10 in order to transmit input data DI, usually in accordance with a transmitter clock signal. In a complementary manner, the receiver device 2 comprises a receiver circuit 22 configured to receive the signal from the receiver 20 and determine the transmitted data DO.

In many applications efficient and ultra-low power communication solutions are required, e.g., because the receiver device 2 is powered via a battery 24.

However, ultra-low power transmission solutions may also be useful for apparatuses powered from the mains. For example, in order to receive a switch-on command from the remote control 1, the apparatus 2, such as a television, usually may not be switched-off completely but has to remain in a stand-by mode, in which the apparatus 2 is still consuming energy for powering the receiver circuit 22. Conversely, by using an ultra-low power receiver circuit 22, a small energy accumulator 24, such as a rechargeable battery, may be charged when the apparatus 2 is switched on and when the apparatus 2 is switched off: the energy accumulator 24 may be used to power the receiver circuit 22.

Moreover, ultra-low power communication solutions are also useful for receiver circuits 22, which may be powered through the communication channel 3. For example, in case of cables, some lines may directly transfer energy to the receiver. Conversely, in case of wireless communication, such as radio frequency (RF) or IR communications, an energy harvesting circuit 26 may be used. Specifically, such an energy harvesting circuit 26 may be configured to obtain the power supply for the receiver circuit 22 by extracting energy from the wireless communication, e.g., the radio wave or infrared radiation.

SUMMARY

Various embodiments of the present disclosure provide solutions adapted to set the configuration information used by a receiver circuit or any other processing circuit.

As mentioned before, various embodiment of the present disclosure relate to a circuit configured to provide at output a given number $N_{A2}$ of bits of configuration information to be used by a processing circuit.

In various embodiments, the circuit comprises a non-volatile programmable memory providing at output a first group of $N_{A2}$ bits.

In various embodiments, the circuit comprises moreover $N_{A2}$ terminals for receiving a second group of $N_{A2}$ bits. In this case, the circuit may comprise $N_{A2}$ logic gates wherein a first input terminal of each logic gate is connected (e.g., directly) to a respective bit of the output of the non-volatile programmable memory providing the first group of $N_{A2}$ bits, and a second input terminal of each logic gate is connected (e.g., directly) to a respective terminal of the $N_{A2}$ terminals for receiving the second group of $N_{A2}$ bits.

In alternative, or in addition, the circuit may comprise a further memory providing at output a third group of $N_{A2}$ bits. In this case, a first input terminal of each logic gate may be connected (e.g., directly) to a respective bit of the output of the non-volatile programmable memory providing the first group of $N_{A2}$ bits, and a second input terminal of each logic gate may be connected (e.g., directly) to a respective bit of the output of the further memory providing the third group of $N_{A2}$ bits.

In various embodiments, the $N_{A2}$ logic gates may thus provide directly the $N_{A2}$ bits of configuration information to the processing circuit.

In various embodiments, the circuit may comprise both the $N_{A2}$ terminals for receiving a second group of $N_{A2}$ bits and the further memory providing at output a third group of $N_{A2}$ bits.

In this case, logic gates with three inputs may be used, wherein the first input terminal of each logic gate is connected directly to a respective bit of the output of the non-volatile programmable memory providing the first group of $N_{A2}$ bits, the second input terminal of each logic gate is connected directly to a respective terminal of the $N_{A2}$ terminals for receiving the second group of $N_{A2}$ bits and a third input terminal of each logic gate is connected directly to a respective bit of the output of the further memory providing the third group of $N_{A2}$ bits.

Alternatively, the circuit may comprise an additional stage of further logic gates for combining the output of the previous $N_{A2}$ logic gates either with the second group of $N_{A2}$ bits or the third group of $N_{A2}$ bits.

In various embodiments, the non-volatile programmable memory may provide at output further $N_{A1}$ bits of configuration information.

For example, in case unprogrammed/erased bits in the non-volatile programmable memory are set to a low logic value, the $N_{A2}$ logic gates may be OR, NOR, XOR or XNOR gates. Conversely, in case unprogrammed/erased bits in the non-volatile programmable memory are set to a high logic value, the $N_{A2}$ logic gates may be AND, NAND, XOR or XNOR gates.

Accordingly, in various embodiments, the $N_{A2}$ of bits of configuration information may be set by either storing the $N_{A2}$ of bits of configuration information in the non-volatile programmable memory, applying the $N_{A2}$ of bits of configuration information to the $N_{A2}$ terminals for receiving the second group of $N_{A2}$ bits, or storing the $N_{A2}$ of bits of configuration information in the further memory.

BRIEF DESCRIPTION OF THE DRAWINGS

Embodiments of the present disclosure will now be described with reference to the annexed drawings, which are provided purely by way of non-limiting example and in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
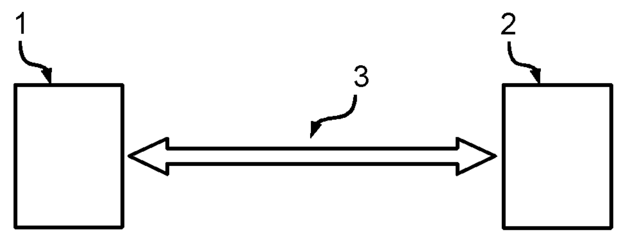
FIGS. 1, 2 and 3 show typical communication systems.
Figure 2:
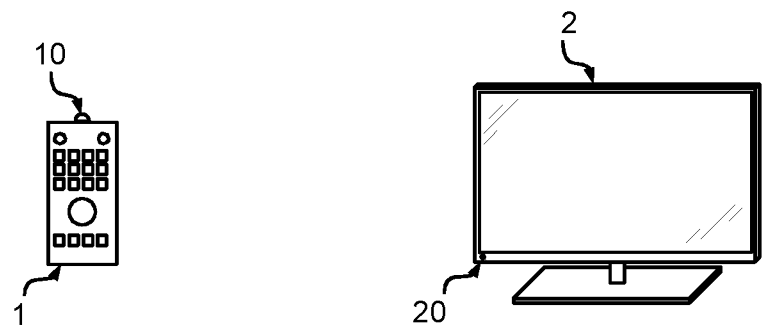
Figure 3:
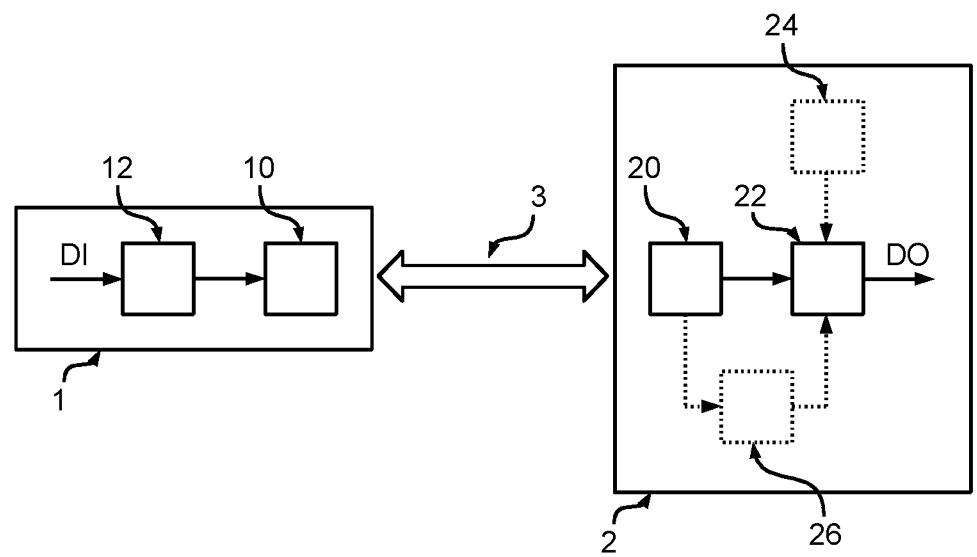

In the following FIGS. 4 to 24 parts, elements or components which have already been described with reference to FIGS. 1 to 3 are denoted by the same references previously used in such Figures; the description of such previously described elements will not be repeated in the following in order not to overburden the present detailed description.

As mentioned in the foregoing, various embodiments of the present disclosure relate to solutions being suitable for ultra-low power communication, i.e. a system with "near zero" power consumption when being in stand-by mode. Accordingly, the solutions described herein may be used in a receiver circuit 22*a* to be used, e.g., in the apparatus 2 described in the foregoing. Possible applications include thus ultra-low power remote controlling, including RFID (Radio-Frequency IDentification) for smart home and smart building applications.

As mentioned in the foregoing, a telecommunication protocol provides rules, including the syntax, semantics and synchronization of communication and possible error recovery methods, that allow two or more entities of a communication system to communicate between them in order to transmit information via a variation of one or more physical quantities. There are many levels of protocols complexity able to manage the information exchanged between two devices (in wireless or cabled mode). The complexity is usually linked to the nature and amount of communication data which have to be transferred: this generates and characterizes the rules and conventions that can be set out to properly define the protocol itself. In a digital communication system, these rules are generically structured and packed with the final target to make them a portable language to be integrated in a custom design. Regardless of the complexity of the protocol, some basic properties are often used to establish a communication.

Figure 14:
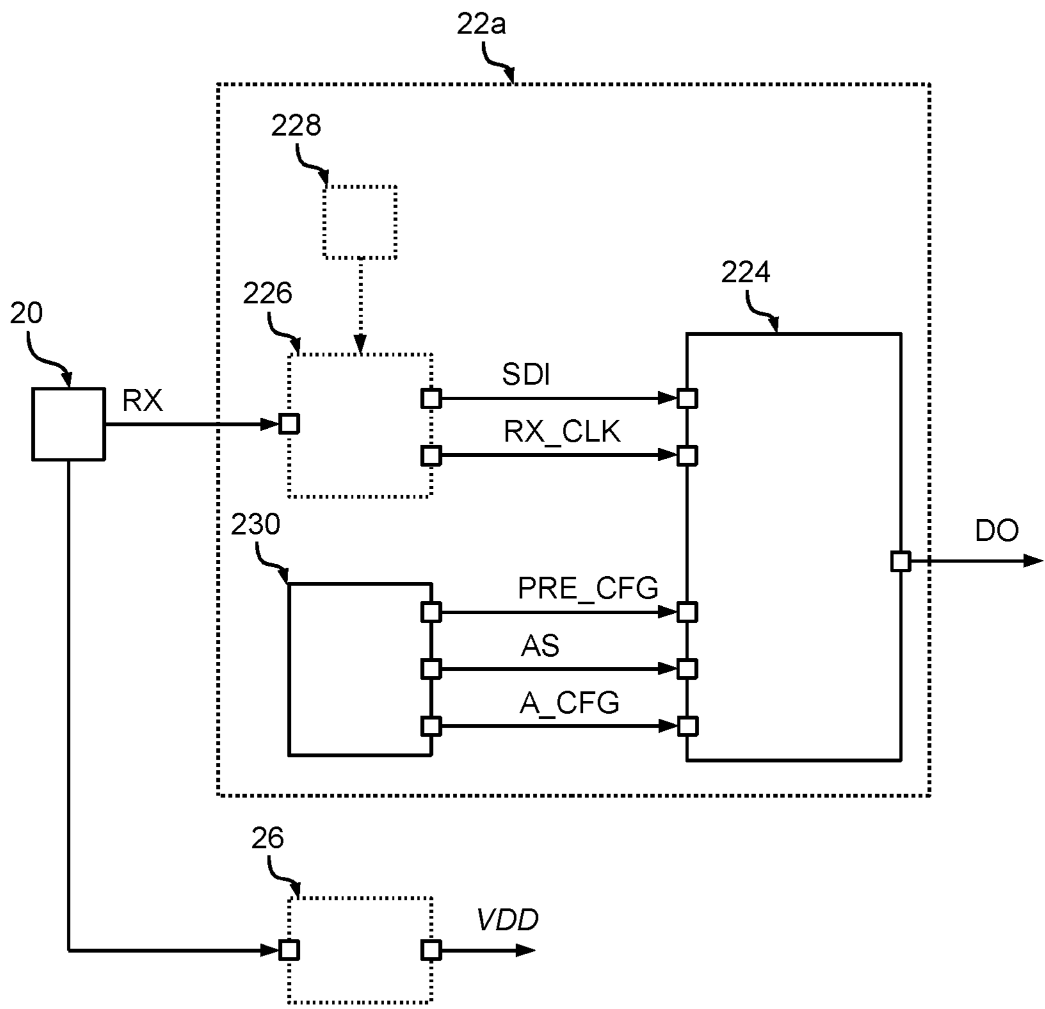

FIGS. 4*a* to 4*d* shows in this regards possible data packets for a serial communication protocol and FIG. 14 shows a possible embodiment of a respective receiver circuit 22*a* configured to determine the data DO transmitted over a wired or wireless communication channel by elaborating a received signal RX provided by a receiver 20, such as an IR or RF receiver, or any other receiver for wired or wireless communication. Accordingly, the data packet may be used for transmitting the data DI from the transmitter circuit 12 to the receiver circuit 22*a*.

Generally, the receiver circuit 22*a* comprises a digital processing circuit 224 and has associated some kind of power supply, such as a battery and/or an electronic converter powered from the mains. For example, in the embodiment shown in FIG. 14, the receiver circuit 22*a* may have associated therewith a power control module or an energy harvesting circuit 26 configured to obtain the supply voltage VDD for the receiver circuit 22*a* from the communication channel, e.g., by extracting energy from an IR radiation or RF wave.

In the embodiment considered, the strings of bits composing the digital message, i.e. the data packet, are divided into fields and each field carries relevant and well-defined information. Moreover, the various fields belong usually to a header HD or a payload PL. For example, the header HD usually contains the fields with more relevance for the protocol, i.e. the information required to transmit the data to a given receiver 22*a*, while the payload contains the data to be transmitted.

For example, in the embodiment considered, the header HD starts with an optional preamble PRE consisting of a fixed sequence of $N_{PRE}$ synchronization bits. The preamble PRE is usually required for serial communications in order to signal the beginning of a new communication. For example, the preamble PRE may be a single bit being set to a given logic value. For example, similar to an UART based communication, the preamble PRE may consist in a single start bit being set, e.g., to "low".

A preambles PRE consisting of a longer sequence may be useful in order to perform a clock and data recovery (CDR) operation, i.e. an operation used to align the clock signal of the receiver 2 with the clock signal of the transmitter 1.

For example, in the embodiment shown in FIG. 14, the receiver circuit 22*a* may comprise a clock and data recovery circuit 226 configured to recover a serial data signal SDI and the receiver clock signal RX_CLK from the received signal RX, i.e., in case of transmission of data, the signal SDI will contain sequentially the bits of the data packet, usually starting from the most significant bit (MSB).

Specifically, such CDR 226 permits to extract the transmitted data sequence from the distorted received signal RX and to recover the associated clock signal RX_CLK. For example, the CDR circuit 226 may comprise a clock recovery circuit configured to detect the transitions in the received data signal RX and generate a periodic clock RX_CLK. Generally, two types of clock and data recovery circuits 226 exits: clock and data recovery circuits operating with a reference clock signal, generated e.g., by an oscillator 228, and clock and data recovery circuits operating without a reference clock signal. Often the circuit 226 comprises also a decision circuit, such as one or more flip-flops, e.g., D flip-flops, connected in cascade, which sample the received data signal RX in accordance with the recovered clock signal RX_CLK. Accordingly, the sampled data signal SDI at the output of the circuit 226 usually has less jitter, skew and/or noise. Reference can be made for this purpose, e.g., to document Ming-ta Hsieh and Gerald E. Sobelman, "*Architectures for Multi-Gigabit Wire-Linked Clock and Data Recovery*", IEEE Circuits and Systems Magazine, December 2008, showing the basic topologies of CDR circuits, which is incorporated herein by reference. For example, in the embodiment considered, a preamble PRE with $N_{PRE}$=7 bits is used.

In various embodiments, the receiver circuit 22*a*, in particular the digital processing circuit 224, may also determine whether the preamble PRE is correct, e.g., by comparing the preamble PRE with a reference preamble PRE_CFG. Generally, the reference preamble PRE_CFG may be fixed within the digital processing circuit 224 or may be provided to the processing circuit 224 by a further module. For example, in the embodiment shown in FIG. 14, the reference preamble PRE_CFG is provided by a memory 230. Generally, the memory 230 may be a volatile memory, such as a register programmed by means of the microprocessor of the receiver apparatus, or a non-volatile memory, including also a one-time-programmable (OTP) memory.

In the embodiment considered, the header HD comprises moreover an address field A having a given number of bits $N_A$. Specifically, the address field A may be used to identify the sender and/or the intended receiver(s), i.e. the sender address and/or the target address. For example, in the embodiment considered, the address field A may contain the address of a receiver or group of receivers. Accordingly, the address A allows the receivers to determine whether the subsequent strings of bits are sent to themselves and should be processed, or should be ignored. Generally, some address values may also have a special meanings and may thus be reserved, i.e. these addresses do not identify transmitter or receivers.

Accordingly, in various embodiments, the receiver circuit 22*a*, in particular the digital processing circuit 224, may be configured to determine whether the address A corresponds to one or more reference addresses A_CFG. Similar to the reference preamble PRE_CFG, the reference addresses A_CFG may be fixed within the processing circuit 224 or may be provided to the processing circuit 224 by a further module. For example, in the embodiment shown in FIG. 14, one or more reference addresses A_CFG are provided by the memory 230, which again may be a volatile memory or a non-volatile memory. Generally, also a first part (e.g., the first 8 bits) of the reference address A_CFG could be fixed and a second part (e.g., the remaining 8 bits) could be programmable.

Figure 4A:
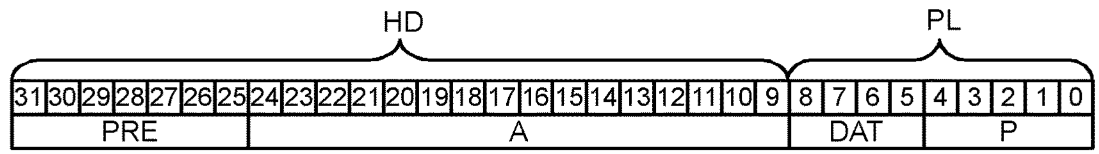
FIGS. 4*a* to 4*d* show an exemplary a communication protocol.
Figure 4B:
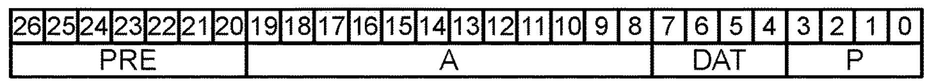
Figure 4C:
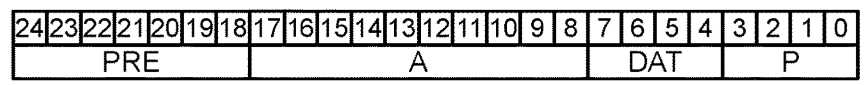
Figure 4D:
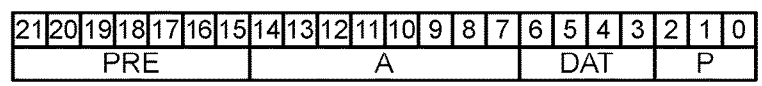

In various embodiments, the address size, i.e. the number of bits $N_A$ of the address A, is variable in order to make the communication protocol compliant with different system capabilities and/or with multiple areas of application. For example, in the embodiment considered, the address field A has 16 bits. Conversely, FIGS. 4*b*, 4*c* and 4*d* show the respective data packet with address fields A having a length of 12, 10 and 8 bits.

For example, in the embodiment shown in FIG. 14, an address selection signal AS is used to indicate which address length should be used. For example, in the embodiment considered, the address selection signal AS may comprise two bits in order to select between an address length of 16, 12, 10 or 8 bits.

For example, in the embodiment shown in FIG. 14, the address selection signal AS is provided by the memory 230, which again may be a volatile memory or a non-volatile memory. For example, in various embodiments, the reference preamble and the address selection signal AS are set once (e.g., by the producer of the receiver circuit 22*a*), while the reference address A_CFG of the receiver circuit 22*a* may be set dynamically at least in part (e.g., by the producer of the complete receiver apparatus), e.g., by programming the memory 230.

Generally, the length $N_A$ of the address field A may also be determined dynamically based on a given bit sequence in the header HD. For example, different preambles PRE may be used for different address lengths or the first bits of the address field A may represent the address selection signal AS. For example, the first two bits of the address A may be used in order to select between an address length of 8, 10, 12 or 16 bits.

Conversely, the data/payload frame PL includes the digital information DAT (e.g., the input data DI shown in FIG. 3, and possible other data) to be transmitted, such as data, configuration setting and/or instruction command codes, which allow the receiver apparatus to perform a defined operation. For example, in the embodiment considered, the data field DAT consists of $N_D$=4 bits, which may indicate the button pressed on a remote control 1. Accordingly, in the embodiment considered, a television or another receiver apparatus may be switched on by including one of the addresses A_CFG of the receiver 22*a* of the respective receiver apparatus in the address field A and the code of the power button in the data field DAT.

Detection of transmission errors may be required for communication channels, which cannot guarantee error-free operation. For this reason, in various embodiments, a number $N_P$ of additional bits P may be added, e.g., at the end of packet, thereby permitting a Cyclic Redundancy Check (CRCs) or parity check, which makes it possible for the receiver circuit 22*a* to detect differences introduced in the data packet by communication errors. For example, in this case, the receiver circuit 22*a* may reject the packet and/or arrange a retransmission.

Generally, the number $N_P$ of error-checking bits P may also vary based on the number of bits to be verified. For example, in the embodiment considered, excluding the preamble, with each four bits to be checked is associated a respective parity bit P. For this reason, the packet shown in FIG. 4*a* may comprise 5 bits P, the packets shown in FIGS. 4*b* and 4*c* may comprise 4 bits P and the packet shown in FIG. 4*d* may comprise 3 bits P.

Packets may also be lost or suffer from long delays. To cope with this, in various embodiments, the transmitter circuit may expect an acknowledgement of correct reception from the receiver circuit 22*a* within a certain amount of time. On timeouts, the transmitter circuit may assume that the packet was not received and retransmit it. In case of a permanently broken link, the retransmission has no effect so the number of retransmissions is usually limited. In this case, exceeding the retry limit may be considered as a communication error.

The inventors have observed that the communication protocol shown in FIGS. 4*a* to 4*d* has several disadvantages.

Specifically, due to the fact, that the address field A may have different lengths, the position of the payload, including the data field DAT and possibly the bits P changes. Accordingly, complex multiplexing logic is required, e.g., in order to select the correct bits as data bits DAT.

Figure 5A:
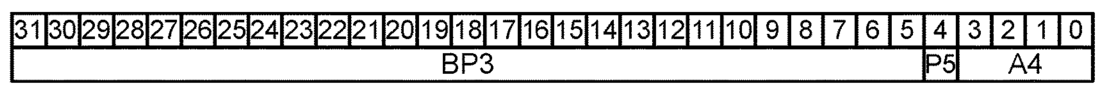
FIGS. 5*a* to 5*d* show a first embodiment of a communication protocol in accordance with the present disclosure.
Figure 5B:
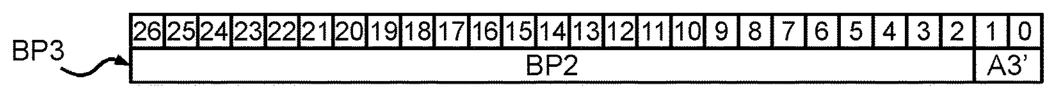

FIGS. 5*a* and 5*b* show in this regards a first embodiment of modified data packets being adapted to transmit the same content as the respective data packets shown in FIGS. 4*a* to 4*d*.

As shown in the foregoing, the address selection signal AS may be considered as a data packet format selection signal, which selects between in a plurality of different data packet formats having a different total number of bits $N_{PF}$.

Generally, each data packet comprises one or more fields with fixed number of bits, such as the optional preamble PRE and the data field DAT, and one or more fields with having a variable number of bits, such as the address field A and the optional bit sequence for error checking P, wherein the number of these bits is however fixed for each packet format.

Moreover, when comparing the various data packets formats shown in FIGS. 4*a* to 4*d*, the number of bits of the fields with variable number, i.e. the address A and the error checking bits P, never decreases.

Accordingly, in various embodiments, when switching to a packet format having a greater number of bits, the additional bits are transmitted at the end of the data packet.

Figure 5C:
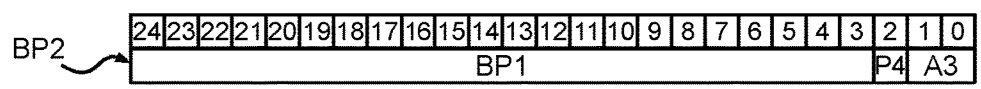
Figure 5D:
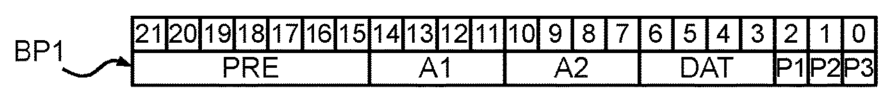
Figure 6A:
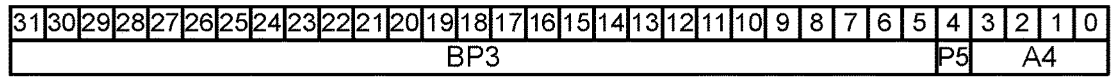
FIGS. 6*a* to 6*d* show a second embodiment of a communication protocol in accordance with the present disclosure.
Figure 6B:
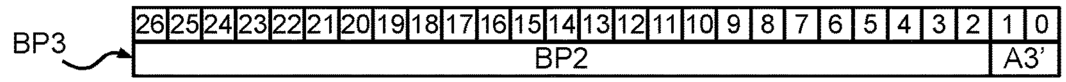
Figure 6C:
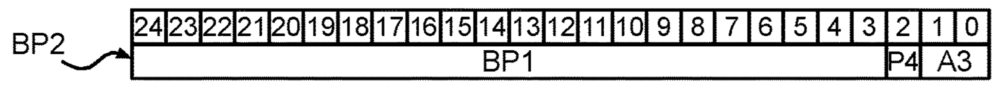
Figure 6D:
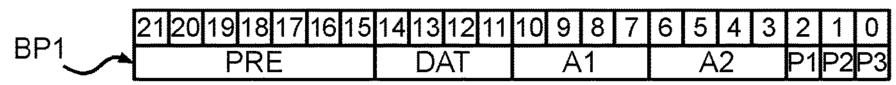
Figure 7A:
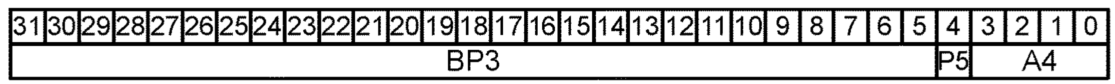
FIGS. 7*a* to 7*d* show a third embodiment of a communication protocol in accordance with the present disclosure.
Figure 7B:
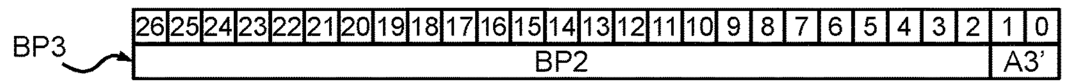
Figure 7C:
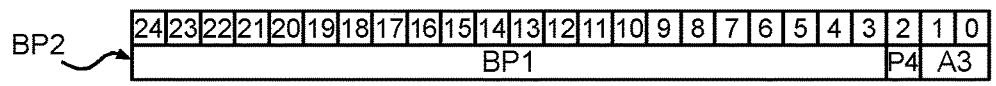
Figure 7D:
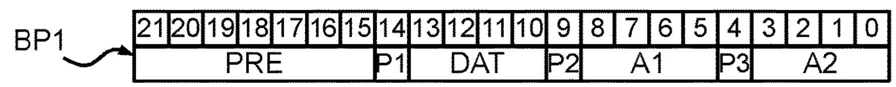

For example, in the embodiment considered in FIGS. 5*a* to 5*d* are again supported four packet formats for address fields with a length of 8, 10, 12 and 16 bits. In the embodiment considered, the shortest data packet BP1 is shown in FIG. 5*d* and corresponds substantially to the data packet shown in FIG. 4*d*, i.e. the data packet BP1 comprises in sequence: the optional preamble (e.g., having $N_{PRE}$=7 bits), one or more address sub-fields A1 and A2 (e.g., having a total of $N_A$=8 bits), a data field DAT (e.g., having $N_D$=4 bits), and optional error checking bits P (e.g., $N_P$=3 bits P1, P2 and P3). For example, in the embodiment considered, the shortest data packet BP1 has a total of $N_{PF}$=21 bits.

However, when changing to the next longer packet format, the packet structure of the first bits corresponds always to the packet structure of the previous shorter format and the additional bits are added at the end of the data packet.

For example, in the embodiment considered, the next data packet format BP2 shown in FIG. 5*c* would support address fields having a total of $N_A$=10 bits and $N_P$=4 error checking bits P. Accordingly, two additional address bits and an additional error checking bit P4 have to be transmitted. As mentioned in the foregoing, these additional bits are transmitted at the end of the data packet. For example, as shown in FIG. 5*c*, the first bits of the data packet BP2 correspond to the data packet BP1 followed by the additional error checking bit P4 and an additional address sub-field A3 having two bits.

Similarly, in the embodiment considered, the next data packet format BP3 shown in FIG. 5*b* would support address fields having a total of $N_A$=12 bits and $N_P$=4 error checking bits P. Accordingly, two additional address bits have to be transmitted. Again, these additional bits are transmitted at the end of the data packet, i.e. the first bits of the data packet BP3 correspond to the data packet BP2 followed by an additional address sub-field A3' having two bits.

Finally, the next data packet format shown in FIG. 5*a* supports address fields having a total of $N_A$=16 bits and $N_P$=5 error checking bits P. Accordingly, four additional address bits and an additional error checking bit P5 have to be transmitted. For example, as shown in FIG. 5*a*, the first bits of the data packet may correspond to the data packet BP3 followed by the additional error checking bit P5 and an additional address sub-field A4 having four bits.

Thus, the data packet formats shown in FIGS. 5*a* to 5*d* permit to transmit the same content as the data packet formats shown in FIGS. 4*a* to 4*d*, and only the position of the various bits within the data packet change.

FIGS. 6*a* to 6*d* show a second embodiment of the data packet formats, wherein the shortest data packet BP1, i.e. the data packet for address fields A with a length of $N_A$=8 bits, has a different format. Specifically, in the embodiment considered the data packet BP1 comprises in sequence: the optional preamble (e.g., having $N_{PRE}$=7 bits), the data field DAT (e.g., having $N_D$=4 bits), one or more address sub-fields A1 and A2 (e.g., having a total of $N_A$=8 bits), and optional error checking bits P (e.g., $N_P$=3 bits P1, P2 and P3). Accordingly, merely the position of the data bits DAT and the address bits A1/A2 have changed in the data packet shown in FIG. 6*d*. Also in this case, the longer data packet formats comprise at the beginning the bits of the previous data packet format and at the end the additional bits. Accordingly, the respective description will not be repeated and reference can be made to the description of FIGS. 5*a* to 5*c*.

FIGS. 7*a* to 7*d* show a third embodiment of the data packet formats, wherein the shortest data packet BP1 has a different format. Specifically, in the embodiment considered the error checking bits P1, P2 and P3 are interleaved between the data field DAT and the address field A, e.g., at the beginning of the data field DAT, the first address sub-field A1 (e.g., having 4 bits) and the second address sub-field A2 (e.g., having 4 bits). Also in this case, the longer data packet formats comprise at the beginning the bits of the previous data packet format and at the end the additional bits. Accordingly, the respective description will not be repeated and reference can be made to the description of FIGS. 5*a* to 5*c*.

In general, the communication protocol described in the foregoing supports at least two data packet formats having a different number of bits. Specifically, the shorter data packet format (e.g., BP1) comprises a plurality of fields, each field of the shorter data packet format having a given number of bits, and the longer data packet format (e.g., BP2) contains at the beginning the bits of the shorter data packet format and at the end at least one additional bit being associated with at least one field of the shorter data packet format, thereby increasing the number of bits of the respective field. For example, in the embodiments considered, the number of bits $N_A$ of the address field A are increased in this way.

As mentioned in the foregoing, the data packet formats shown in FIGS. 5, 6 and 7 have the same number of bits as the respective data packet formats shown in FIG. 4 and only the position of the bits changes. However, the modified data packet formats permit a more efficient implementation of the digital processing circuit 224 used to determine the transmitted data DO based on the serial data signal SDI (or directly the received signal RX).

Figure 8:
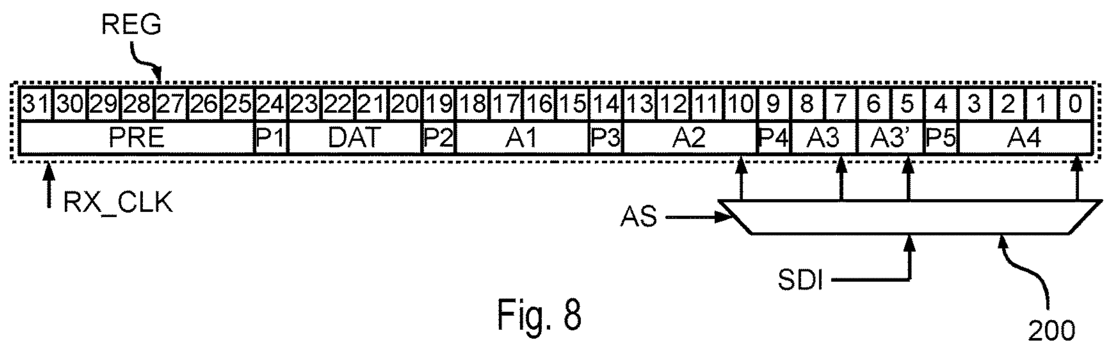
FIGS. 8, 9*a*-9*d*, 10*a*-10*d*, 11, 12, 13, 14, 15, 16, 17*a*-17*c* and 18 show various embodiments of receiver circuits in accordance with the present disclosure.
Figure 9A:
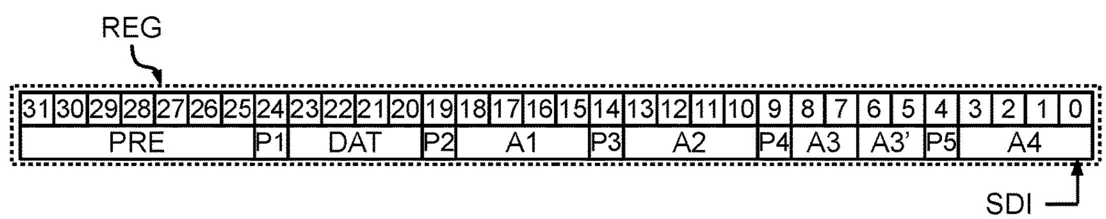
Figure 9B:
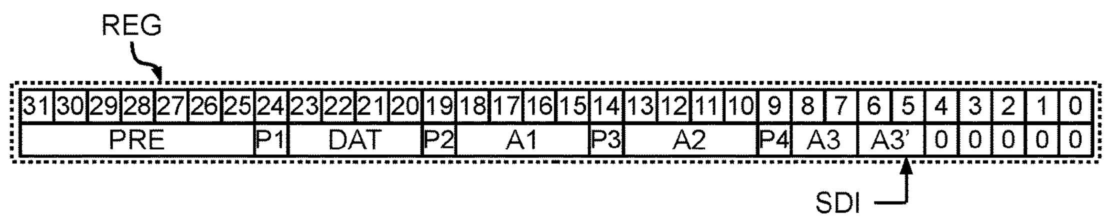
Figure 9C:
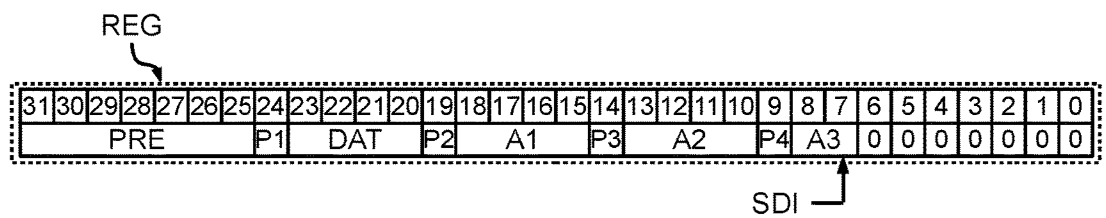
Figure 9D:
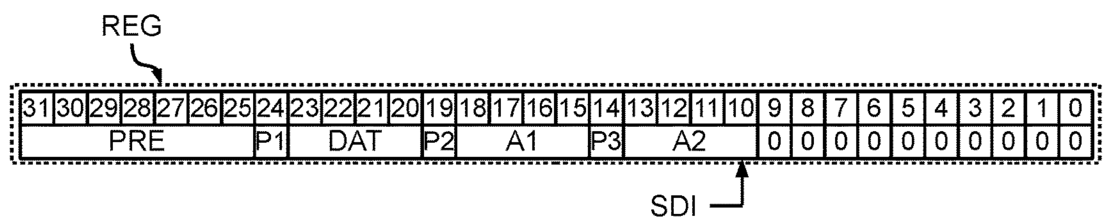

For example, as shown in FIG. 8, the processing circuit may comprise a shift register REG having a number of bits $N_{REG}$ corresponding to the number of bits $N_{PF}$ of the longest data packet format supported, e.g., 32 bits for the embodiments considered in the foregoing.

However, instead of simply loading the serial input data SDI into the shift register, the register has associated therewith one or more multiplexers 200 configured to select the input position of the register REG in which the serial data signal SDI is loaded. Specifically, in the embodiment considered, the selection is performed based on the signal AS, i.e. the address length/packet data format selection signal.

In the embodiment considered, the multiplexer(s) 200 are configured to select the input position for loading the shift register REG at the following bit position POS:

$$POS=N_{REG}-N_{PF} \quad (1)$$

where $N_{PF}$ corresponds to the number of bits of the selected data packet format. For example:

when the length of the address A is selected as $N_A$=16 bits ($N_{PF}$=32), the position of the input of the shift register would be set to 0, i.e. the 1st register;

when the length of the address A is selected as $N_A$=12 bits ($N_{PF}$=27), the position of the input of the shift register would be set to 5, i.e. the 6th register;

when the length of the address A is selected as $N_A$=10 bits ($N_{PF}$=25), the position of the input of the shift register would be set to 7, i.e. the 8th register; and when the length of the address A is selected as $N_A$=8 bits ($N_{PF}$=22), the position of the input of the shift register would be set to 10, i.e. the 11th register.

In this regards, it may be observed that, when changing to the next longer packet format, the input position of the shift register REG is shifted by the number of the additional bits added at the end of the longer packet format.

Accordingly, in the embodiments considered, the received bits are sequentially load in accordance with the clock signal RX_CLK into the shift register REG and once having received all bits of data packet, i.e. $N_{PF}$ bits, the respective bits are always located in the most significant bits of the shift register REG, while the least significant bits may remain empty, i.e. the bits being associated with the shortest data packet format BP1 and which are included at the beginning of all other data packet formats are always loaded into the most significant bits of the register REG.

Moreover, as shown in FIGS. 9*a* to 9*d*, the bits are always loaded into the same position, e.g., the preamble PRE is always in the positions [31:25] and the data field DAT is always in the positions [23:19]. Similarly, the sub-field A1 and A2 of the address A are always in the positions [18:15] and [13:10], respectively. Accordingly, thanks to the specific data packet format used and the selection of the position of the serial input of the shift register REG, the bit positions remain unchanged and merely the least significant bits of the shift register REG are selectively filled with the additional bits introduced with the longer data packet formats. For example, in FIG. 9*c* the error checking bit P4 and the sub-field A3 of the address A are loaded in the positions [9] and [8:7], respectively. Similarly, the additional two bits of the sub-field A3' of the address A are loaded in the positions [6:5]. Finally, the error checking bit P5 and the sub-field A4 of the address A are loaded in the positions [4] and [3:0] in FIG. 9*a*. In case the respective bits are not transmitted, the respective positions remain unchanged, e.g., remain set to "0".

This is also highlighted in FIGS. 10*a* to 10*d* which show possible load operations of the shift register REG for the different packet formats.

Figure 10A:
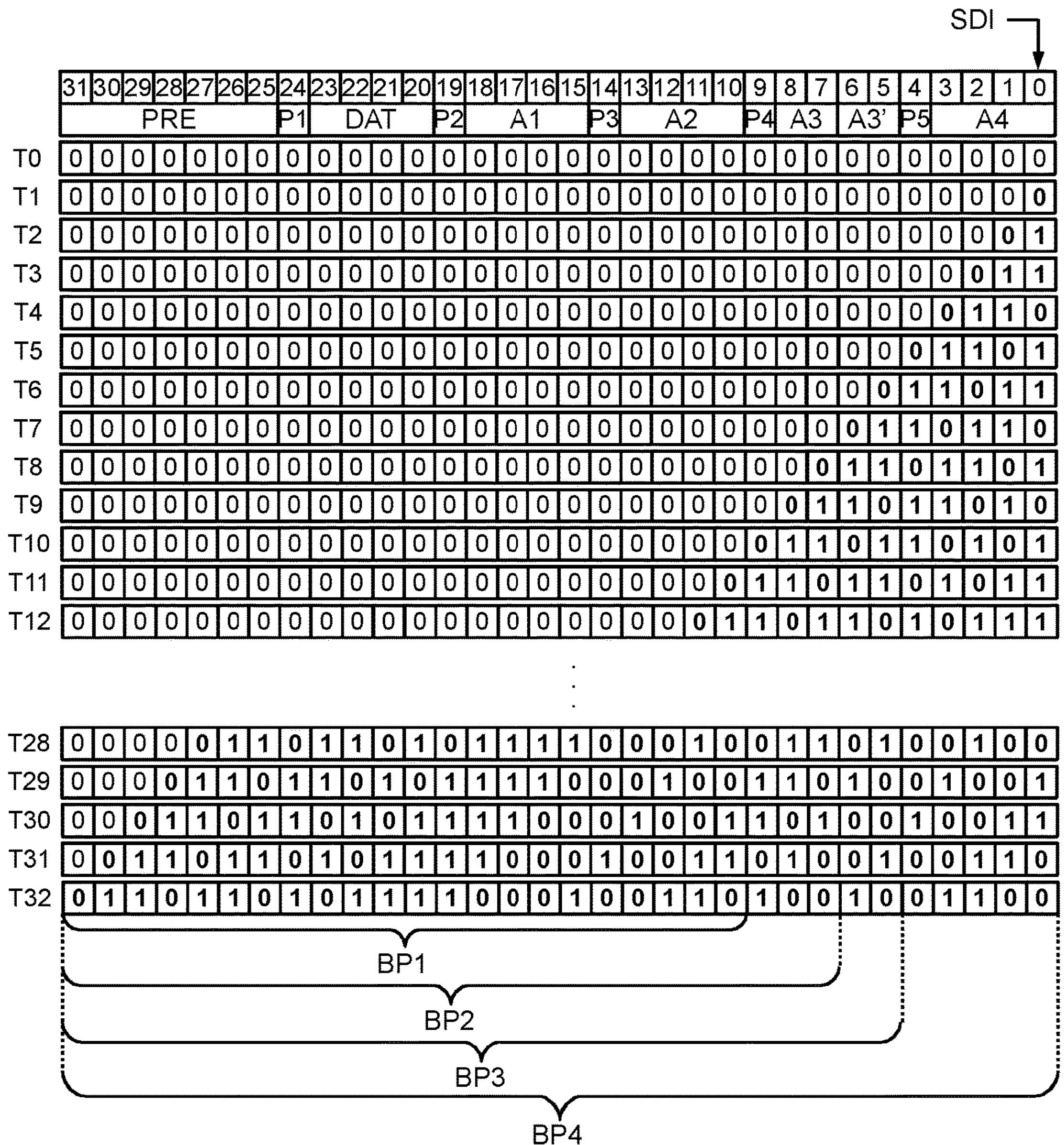

Specifically, in the example considered in FIG. 10*a*, the bits of the register REG are set all to "0" at a time T0, corresponding thus to a reset condition. Moreover, in FIG. 10*a* the longest packet format is selected, i.e. 16 address bits and the position of the input of the shift register would be set to 0.

At a time T0 the first bit (i.e. the first preamble bit) is received, which is loaded thus in the bit position 0. During the following clock cycles, the subsequent bits are received and the bits are shifted from the input position to the MSB bits of the shift register. For example, at the time T12, 12 bits have been received and the content of the shift register could be "0000000 00000 00000 00001 10110 10111". The operation proceeds until all bits have been received at a time T32 (i.e. after 32 clock cycles) and the content of the shift register is, e.g., "0110110 10111 10001 00110 10010 01100". Accordingly, in the example considered, the data packet shown in FIGS. 7*a* to 7*d* would have the following content:

preamble PRE: "0110110";

data field DAT: "0111" corresponding to a hexadecimal code "7";

address field A: "0001 0110 0010 1100" corresponding to a hexadecimal code "162C"; and error checking bits P: "11010".

Figure 10B:
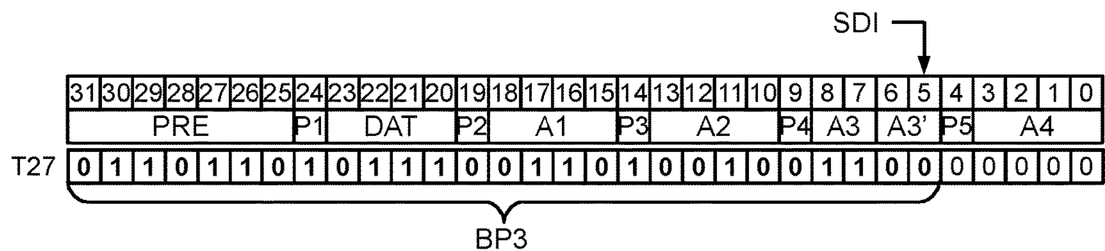

Similarly, FIG. 10*b* shows an example for an address length of 12 bits, where the position of the input of the shift register would be set to 5. In this case, the data packet contains only 27 bits, i.e. all bits have been received at a time T27 and the content of the shift register is, e.g., "011011010111 10111 00110 10010 01100 00000". Accordingly, in the example considered, the data packet shown in FIGS. 7*a* to 7*d* would have the following content:

preamble PRE: "0110110";

data field DAT: "0111" corresponding to a hexadecimal code "7";

address field A: "0110 0010 1100 0000" corresponding to a hexadecimal code "62Co", with the last four bits being unused; and error checking bits P: "10100", with the last error checking bit being unused.

Figure 10C:
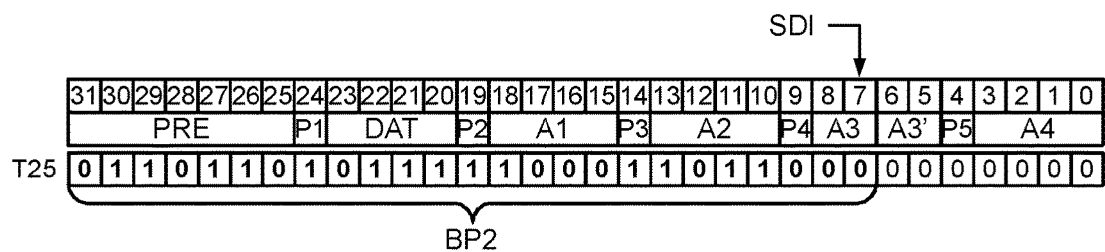

Similarly, FIG. 10*c* shows an example for an address length of 10 bits, where the position of the input of the shift register would be set to 7. In this case, the data packet contains only 25 bits, i.e. all bits have been received at a time T25 and the content of the shift register is, e.g., "011011010111 10111 11000 11011 00000 00000". Accordingly, in the example considered, the data packet shown in FIGS. 7*a* to 7*d* would have the following content:

preamble PRE: "0110110";

data field DAT: "0111" corresponding to a hexadecimal code "7";

address field A: "1000 1011 0000 0000" corresponding to a hexadecimal code "8B00", with the last six bits being unused; and error checking bits P: “11100”, with the last error checking bit being unused.

Figure 10D:
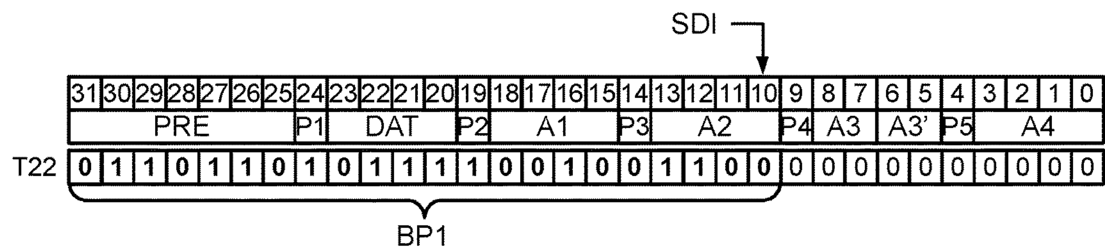

Finally, FIG. 10*d* shows an example for an address length of 8 bits, where the position of the input of the shift register would be set to 10. In this case, the data packet contains only 22 bits, i.e. all bits have been received at a time T22 and the content of the shift register is, e.g., “011011010111 10111 10010 01100 00000 00000”. Accordingly, in the example considered, the data packet shown in FIGS. 7*a* to 7*d* would have the following content:

preamble PRE: “0110110”;

data field DAT: “0111” corresponding to a hexadecimal code “7”;

address field A: “0010 1100 0000 0000” corresponding to a hexadecimal code “2C00”, with the last eight bits being unused; and error checking bits P: “11000”, with the last two error checking bits being unused.

The use of a shift register REG, instead of a complete FIFO (First-In First-Out) memory has the advantage that no complex FIFO control logic is required. Moreover, the bits in the shift register REG may be processed completely in parallel.

Figure 11:
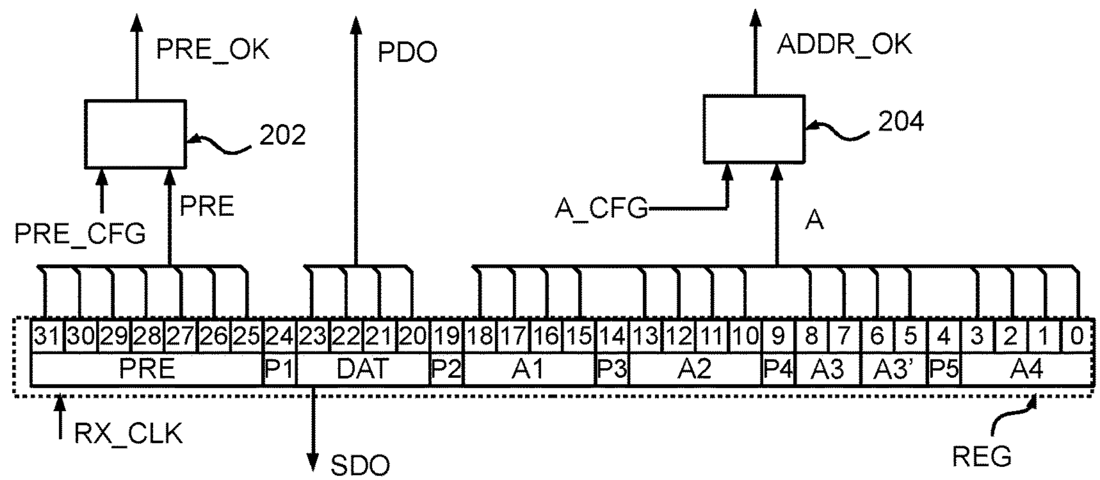

For example, as shown in FIG. 11, the receiver circuit 22*a*, in particular the digital processing circuit 224, may comprise a preamble verification circuit 202 configured to generate a signal PRE_OK indicating whether the received preamble PRE (if supported by the packet data format) corresponds to the reference preamble PRE_CFG. For this purpose, the circuit 202 may simply perform a bit level comparison between the first $N_{PRE}$ bits stored in the register REG, e.g., 7 bits for the exemplary preamble, and the bits of the reference preamble PRE_CFG.

Similarly, the receiver circuit 22*a*, in particular the digital processing circuit 224, may comprise an address verification circuit 204 configured to generate a signal ADDR_OK indicating whether the received address A corresponds to the reference address A_CFG. Generally, the circuit 204 may also compare sequentially or in parallel the received address A with a plurality of reference addresses A_CFG.

In various embodiment, the circuit 202 performs for this purpose a bit level comparison between the bits assigned to the address field of the longest data packet format, i.e. the sub-fields A1, A2, A3, A3' and A4 having a total of $N_A$=16 bits, and the bits of the reference address A_CFG, which also has 16 bits. Accordingly, by setting the unused bits of the reference address A_CFG to the reset value of the register REG, the comparison will be performed for the received address bits, while the comparison for the “empty” bits will intrinsically be positive. Generally, the address verification circuit 204 could also receive the signal AS and perform the comparison only for the address bits indeed received, thereby reducing the risk that a user incidentally configured an address reference signal A_CFG having the wrong content for the address bits being unused in the selected data packet format.

Figure 12:
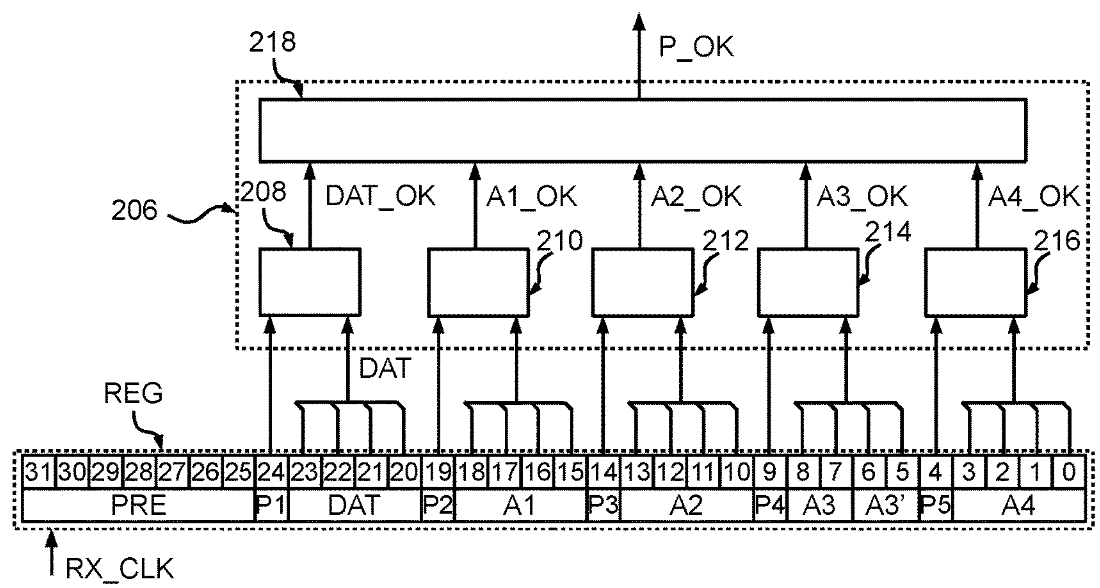

Similarly, FIG. 12 shows an embodiment of an error checking circuit 206. Specifically, in the embodiment considered, the error checking circuit 206 receives at input the data field DAT, the address field A (including the sub-fields A1, A2, A3, A3' and A4) and the error checking bits P.

Accordingly, in the embodiment considered, the error checking circuit 206 performs the same operation already performed in the transmitter circuit in order to compute error checking bits P for the received data field DAT and the received address field A and then compares the computed error checking bits with the received error checking bits P (e.g., the bits P1, P2, P3 P4 and P5 in the bit positions [24], [19], [14], [9] and [4], respectively).

For example, in the embodiment considered, the error checking bits P are parity bits. Generally, the parity bits P may be even parity bit or odd parity bit. In the case of even parity, the number of bits whose value is “1” in a given set are counted. If that total is odd, the parity bit value is set to 1, making the total count of “1”’s in the set an even number. If the count of ones in a given set of bits is already even, the parity bit’s value remains “0”. In the case of odd parity, the situation is reversed. Instead, if the sum of bits with a value of “1” is odd, the parity bit’s value is set to zero. And if the sum of bits with a value of “1” is even, the parity bit value is set to “1”, making the total count of “1”’s in the set an odd number. Accordingly, Even parity is a special case of a cyclic redundancy check (CRC), where the “1”-bit CRC is generated by the polynomial x+1.

For example, in the embodiment considered, the parity bits P are assigned in the following way:

parity bit P1 for the data field DAT, parity bit P2 for the address sub-field A1, parity bit P3 for the address sub-field A2, parity bit P4 for the combination of the address sub-field A3 and the address sub-field A3', and parity bit P5 for the address sub-field A4.

Accordingly, in the embodiment considered, each parity bit is assigned to a unique sequence of four bits.

Accordingly, respective parity checking circuit 208, 210, 212, 214 and 216 may be used to compute separately the parity bits for the data field DAT, the address sub-field A1, the address sub-field A2, the combination of the address sub-field A3 and the address sub-field A3' and the address sub-field A4, respectively, and determine whether the computed parity bits corresponds to the respective received parity bits. For example, in the embodiment considered, the circuits 208, 210, 212, 214 and 216 generate respective signals DAT_OK, A1_OK, A2_OK, A3_OK and A4_OK indicating whether the received data field DAT, address sub-field A1, address sub-field A2, combination of the address sub-field A3 and the address sub-field A3' and address sub-field A4 are correct.

Accordingly, a further circuit 218 may be used to logically combine the signals DAT_OK, A1_OK, A2_OK, A3_OK and A4_OK in order to generate a signal P_OK indicating that the received data DAT and address A do not contain errors.

Generally, the error checking circuit 206 may also perform more complex operations, e.g., in order to recover errors by means of Reed Solomon Codes. However, in case of ultra-low power communication, a simple parity check may be sufficient.

In the embodiment considered, the data field DAT has a fixed length of $N_D$ bits. Accordingly, the content of this field DAT, e.g., the bits [23:20] in the exemplary embodiment, may be read in parallel by means of a parallel data output signal PDO. Generally, the data field DAT may also be read sequentially for $N_D$ clock cycles by means of a serial data output signal SDO being connected to the first bit of the data field DAT (e.g., bit [23]).

Figure 13:
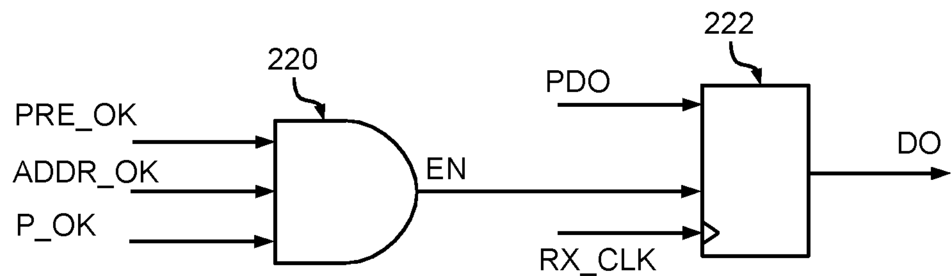

For example, as shown in FIG. 13, a logic circuit 220, such as an AND gate, may be used to generate an enable signal EN indicating whether the received data DAT should be processed by the receiver apparatus, e.g., because the preamble does not contain errors (signal PRE_OK), the received data DAT and address A do not contain errors (signal P_OK) and the received address A corresponds to one of the addresses A_CFG assigned to the receiver circuit (signal ADDR_OK). For example, the signal EN may be used to store the parallel data signal PDO in a register 222 (having e.g., 4 bits). In this case the output of the register 222 may provide the transmitted data DO.

Accordingly, in the embodiments described in the foregoing, the digital processing circuit 224 receives and decodes the address and data bits coming from a receiver 20, such as a radio frequency modulator. The digital processing circuit 224 supports variable address sizes (16, 12, 10 and 8 bits) and the respective reference addresses A_CFG may be pre-configured, e.g., by means of a one-time programmable memory 230 based on anti-fuse cells, or received form a further processing circuit. In various embodiments, the digital processing circuit 224 is able to detect errors in the address and data bits.

The proposed mechanism and the related hardware digital circuit are thus flexible, fast and simple with optimized computational resources in terms of chip-area and power consumption. In fact, the same hardware circuit may be used for variable address sizes without having to add further logic.

Figure 15:
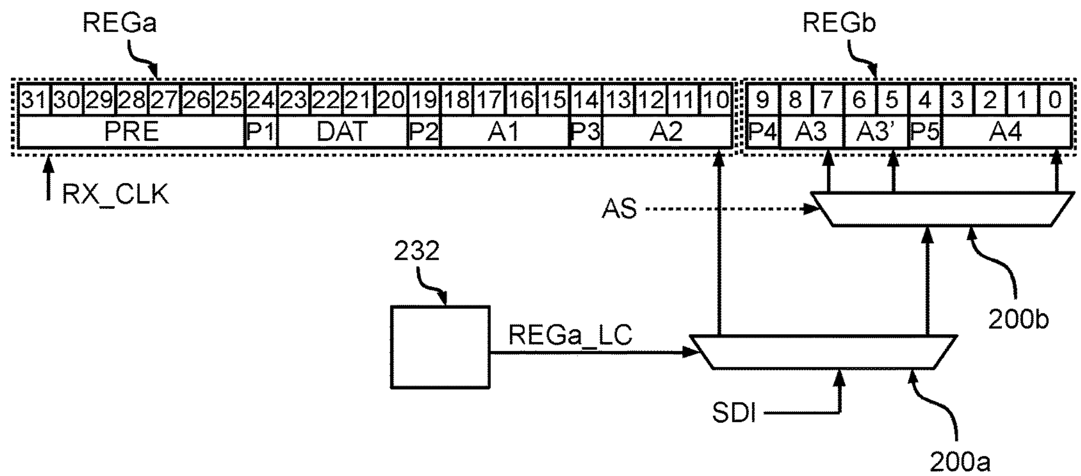

FIG. 15 shows a second embodiment of the receiver circuit.

Specifically, in the embodiment two shift registers REGa and REGb are used instead of the single shift register REG shown in FIGS. 8 to 10.

More particular, the first shift register REGa is used to store the bits of the shortest packet format BP1 and the second shift register REGb is used to store the additional bits when a longer packet format BP2, BP3 or BP4 is selected, i.e. the additional bits of the address sub-fields A3, A3' and A4 and the additional error checking bits P4 and P5. Accordingly, in the embodiment considered, the register REGa has 10 bits, and the register REGb has 22 bits, e.g., numbered [31:10] just for convenience.

Specifically, in the embodiment considered, a first multiplexer 200*a* is used to connect selectively the serial data signal SDI to the serial input of the register REGa or the serial input of the register REGb as a function of a signal REGa_LC indicating whether the register REGa has been loaded completely or not. Specifically, when the signal REGa_LC indicates that the register REGa has not been loaded completely, the serial data signal SDI is connected to the serial input of the register REGa, in particular the least significant bit (e.g., bit 10 for the exemplary bit numeration), and incoming bits are loaded sequentially in the shift register REGa. Conversely, when the signal REGa_LC indicates that the register REGa has been loaded completely, the serial data signal SDI is connected to the serial input of the register REGb and possible further incoming bits are loaded sequentially in the shift register REGb.

However, in this case, the serial input position of the register REGb is not fixed, but determined (similar to the register REG) by means of a one or more multiplexers 200*b* as a function of the signal AS. For example, in the embodiment considered, the multiplexer(s) 200*b* are configured to select the input position for loading the shift register REGb at the following bit position POS:

$$POS=N_{REGb}-(N_{PF}-N_{REGa}) \quad (2)$$

where $N_{PF}$ corresponds to the number of bits of the selected data packet format, and $N_{REGa}$ and $N_{REGb}$ are the number of bits of the registers REGa and REGb, respectively. For example, considering $N_{REGa}$=22 and $N_{REGb}$=10:

when the length of the address A is selected as $N_A$=16 bits ($N_{PF}$=32), the position of the input of the shift register REGb would be set to 0, i.e. the 1st register;

when the length of the address A is selected as $N_A$=12 bits ($N_{PF}$=27), the position of the input of the shift register REGb would be set to 5, i.e. the 6th register;

when the length of the address A is selected as $N_A$=10 bits ($N_{PF}$=25), the position of the input of the shift register REGb would be set to 7, i.e. the 8th register; and when the length of the address A is selected as $N_A$=8 bits ($N_{PF}$=22), the position of the input of the shift register would be set to 10, i.e. the 11th register, which however does not exist, because no additional bits are indeed expected in this case.

Thus also in this case, when changing to the next longer packet format, the input position of the shift register REGb is shifted by the number of the additional bits added at the end of the longer packet format.

Figure 16:
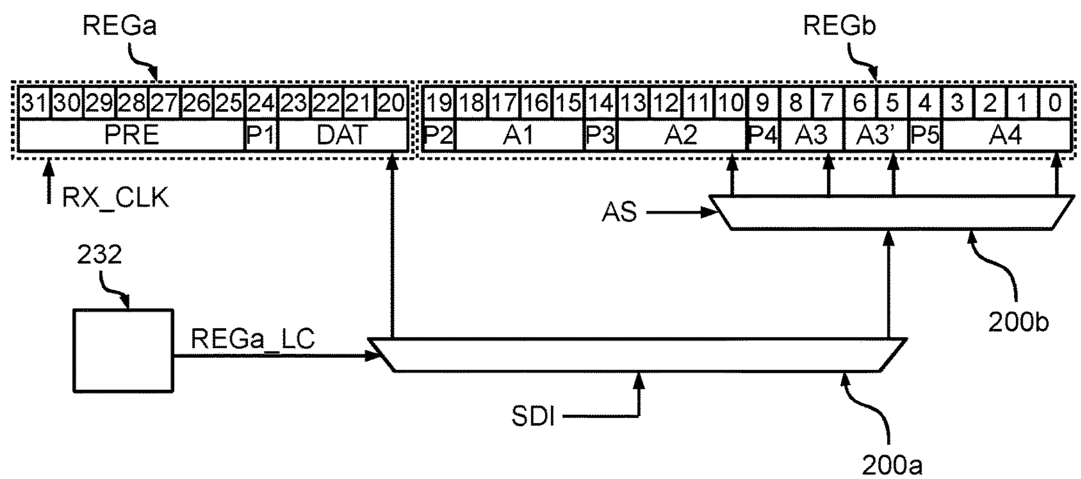

FIG. 16 shows a similar embodiment, in which, however, only a subset of the bits of the shortest packet format BP1 are stored in the register REGa, i.e. the number of bits $N_{REGa}$ is smaller than the number of bits of the packet format BP1, while the sum $N_{REGa}$+$N_{REGb}$ still corresponds to the number of bits of the longest packet format BP4.

For example, in the embodiment considered, only the preamble PRE, the first error checking bit P1 and the data field DAT are stored in the register REGa and the remaining bits are stored in the register REGb, i.e. $N_{REGa}$=12 and $N_{REGb}$=20. Accordingly, in this case, the first 12 bits are loaded into the register REGa and once the signal REGa_LC indicates that the register REGa is fully loaded, following bits are loaded into the register REGb, wherein the input position of the register REGb is selected by means of the multiplexer 200*b* according to equation (2), i.e.:

when the length of the address A is selected as $N_A$=16 bits ($N_{PF}$=32), the position of the input of the shift register REGb would be set to 0, i.e. the 1st register;

when the length of the address A is selected as $N_A$=12 bits ($N_{PF}$=27), the position of the input of the shift register REGb would be set to 5, i.e. the 6th register;

when the length of the address A is selected as $N_A$=10 bits ($N_{PF}$=25), the position of the input of the shift register REGb would be set to 7, i.e. the 8th register; and when the length of the address A is selected as $N_A$=8 bits ($N_{PF}$=22), the position of the input of the shift register would be set to 10, i.e. the 11th register.

Again, when changing to the next longer packet format, the input position of the shift register REGb is shifted by the number of the additional bits added at the end of the longer packet format.

The processing part of the content of the registers REGa and REGb may remain unchanged compared to the embodiments having only a single register REG. Accordingly, reference can be made to FIGS. 11, 12 and 13 and the respective description, showing how the content of the respective bits/fields stored now in the registers REGa and REGb may be processed, in particular with regards to the preamble verification (block 202) the address verification (block 204) and the error checking function (block 206).

As mentioned in the foregoing, the signal REGa_LC indicates whether the register REGa has been loaded completely or not. In the embodiments shown in FIGS. 15 and 16, this may be obtained by means of a counter 232 configured to determine whether a count value (being incremented each time a new bit is received) has reached the number of bits $N_{REGa}$ of the register REGa (e.g., 22 for FIGS. 15 and 12 for FIG. 16), wherein the signal REGa_LC is set:

to a first logic value, e.g., low, when the count value is smaller than the number of bits $N_{REGa}$, and to a second logic value, e.g., high, when the count value is equal or greater than the number of bits $N_{REGa}$.

Figure 17A:
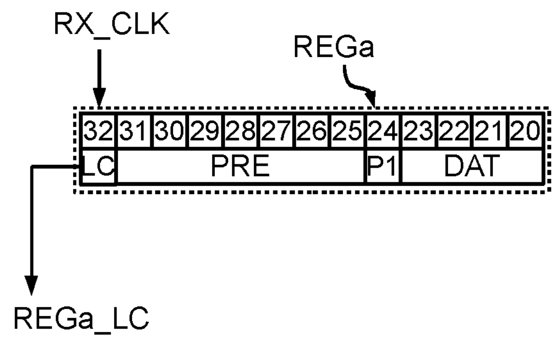
Figure 17B:
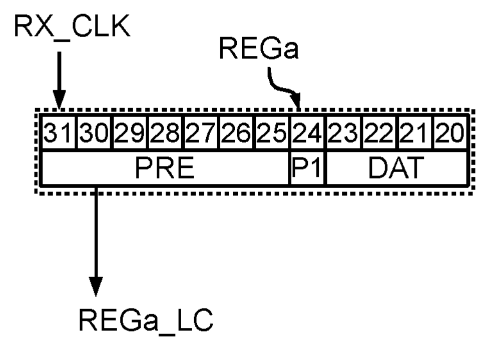
Figure 17C:
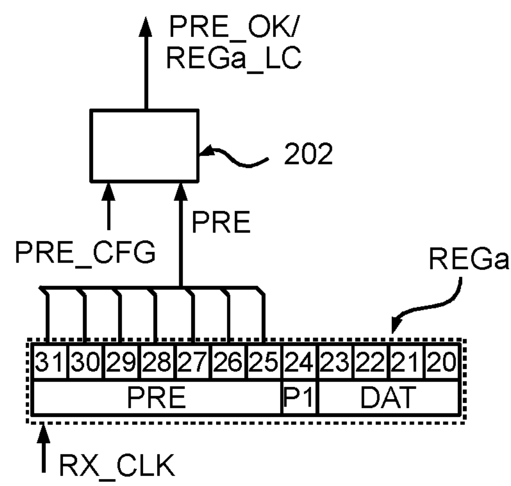

FIGS. 17*a* to 17*c* show instead embodiments, in which the signal REGa is determined directly as a function of the content of the register REGa.

Specifically, in the embodiment shown in FIG. 17*a*, an additional bit LC is added to the shift register REGa as MSB bit (e.g., [32] in the embodiment considered). In this case, when the shift register is reset, all bits are set to a first logic value, e.g., low, except the LSB bit (e.g., [20] in the embodiment considered), which is set to a second logic value, e.g., high. Accordingly, when data are received sequentially via the serial input of the shift register REGa, the bit with the second logic value is shifted form the least significant bit position to the most significant bit position. Accordingly, it is sufficient to determine the signal REGa_LC as a function of the content of the MSB bit LC (e.g., [32] in the embodiment considered). For example, in the embodiment considered, the signal REGa_LC corresponds directly to the content of the bit LC in the register REGa.

Conversely, FIG. 17*b* shows an embodiment, in which no additional bit LC is added, but the expected content of the register REGa is used to determine the signal REGa_LC. For example, considering the previous exemplary preamble "0110110" the second preamble bit may be used as indicator whether the register REGa has been loaded fully, i.e. the signal REGa_LC may be determined as a function of the second preamble bit (e.g., [30] in the embodiment considered). For example, in the embodiment considered, the signal REGa_LC corresponds directly to the content of the second preamble bit, which should be high when the register REGa has been loaded fully.

This embodiment has however the disadvantage that the reference preamble sequence PRE_CFG may not be changed, and errors in the communication may also trigger the signal REGa_LC.

Accordingly, FIG. 17*c* shows an embodiment, in which the complete preamble field PRE is verified and the signal REGa_LC is asserted by means of a block 202 only when the preamble field (e.g., bits [31:15] in the embodiment considered) corresponds to the reference preamble PRE_CFG. This embodiment does not add any overhead, because the preamble verification circuit 202 may already be used to check the preamble field (see FIG. 11). In fact, in this case it is sufficient to determine the signal REGa_LC as a function of the preamble verification signal PRE_OK.

The use of several shift registers has the advantage that, once having received a given number of bits ($N_{REGa}$) the content of the register REGa remains stable, while further bits may still be received and stored in the register REGb.

This behavior may thus be used to determine the used packet format, e.g., the length $N_A$ of the address field A and consequently the signal AS, based on the content of the transmitted data already stored in the register REGa.

For example, in the embodiment shown in FIG. 15, the address selection signal AS may be determined as a function of the address sub-fields A1 and/or A2. For example, the signal AS may correspond to the first two bits of the address sub-field A1 (e.g., bits [18:17] in the embodiment considered).

Figure 18:
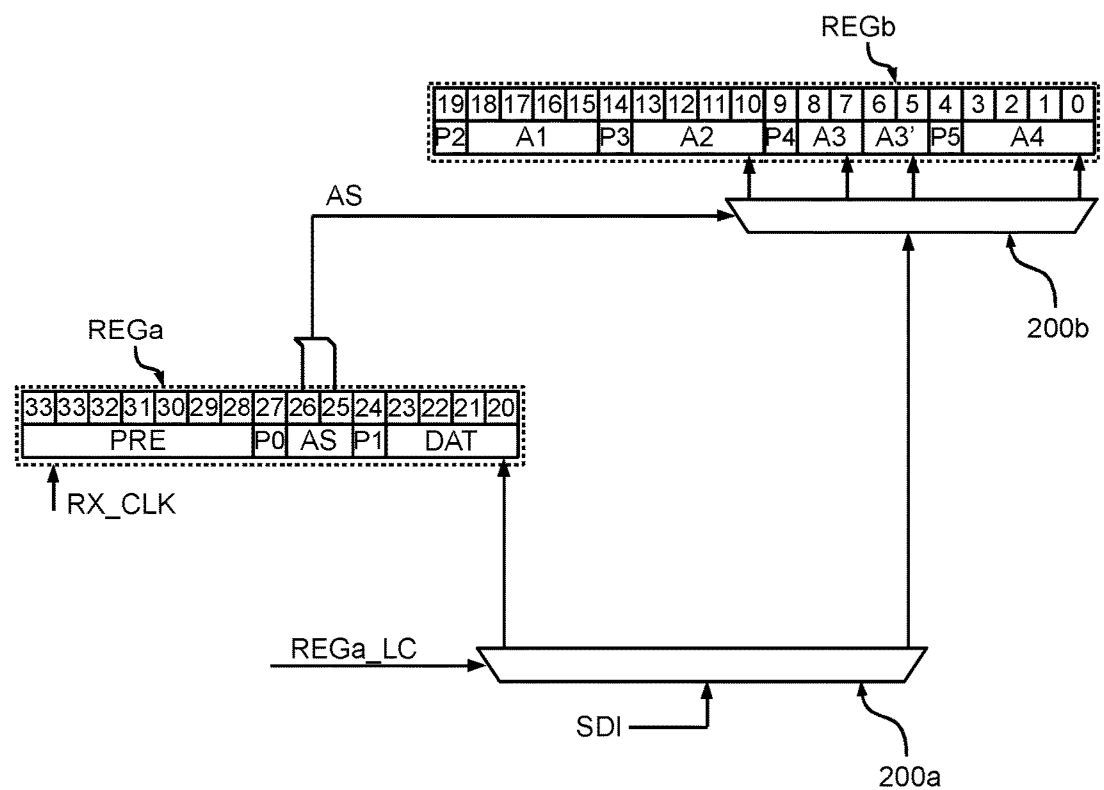

Conversely, FIG. 18 shows an embodiment, in which the packet format BP1 (and accordingly also the longer formats BP2-BP4) comprise an additional address selection field AS (e.g., bits [26:25] in the embodiment considered) and possibly a respective parity bit P0 (e.g., bit [19] in the embodiment considered). In this case, the register REGa has to have a sufficient number of bits in order to receive also this address selection field, and the address selection field AS (and the possible error checking bits P0) preferably follows immediately the preamble PRE.

As mentioned before, also different preambles PRE may be used for different address lengths. For example, in this case a set of preamble verification circuits 202 could be used in order to compare (similar to FIG. 17*c*) the content of the preamble field PRE stored in the register REGa with respective reference preambles PRE_CFG, one for each possible packet format (BP1-BP4), e.g., four preamble verification circuits 202 with respective different reference preamble PRE_CFG. Accordingly, only one of the preamble verification circuits 202 would indicate a correct preamble and this signal may be used (similar to a one-hot encoding) in order to determine the address selection signal AS.

Generally, the receiver circuit 22*a* extracts thus data DO from a serial data signal SDI containing a data packet. The data packet may have a first or a second data packet format (e.g., BP1 or BP2) based on the selection signal AS. In various embodiments, the receiver circuit 22*a* comprises one or more shift registers having a total number of bits being equal or greater than the number of bits of the second/longer data packet format. This receiver comprises moreover a switching circuit 200, 200*a*/200*b* associated with the shift registers, which is configured to selectively connect the serial data signal SDI to one of the serial inputs as a function of the selection signal AS.

Specifically, in the embodiment shown in FIG. 8, a single shift register REG is used, while two shift registers are used in the embodiments shown in FIGS. 15, 16 and 18. In both embodiments, when the first data packet format BP1 has been selected and once having received the bits of the data packet, the respective bits are loaded/stored in given positions of the shift registers. However, when the second data packet format BP2 has been selected and once having received the bits of the data packet, the switching circuit ensures that the bits of the first data packet format BP1 being included in the second data packet format (BP2) are again loaded/stored in the same positions of the shift registers.

For example, in the embodiment shown in FIG. 8, a first input position of the shift register REG is selected for the reception of the bits of the serial data signal SDI when the first packet format BP1 is selected. Conversely, when the second data packet format BP2 has been selected, a second input position is selected for the reception of the bits, wherein the second input position corresponds to the first input position shifted by the number of the additional bits introduced in the second data packet format.

Conversely, in FIGS. 15, 16 and 18, an input position of the first shift register REGa is selected for the reception of a given number of bits of the serial data signal SDI and, once the given number of bits has been received, an input position of the second shift register REGb is selected for the reception of further bits.

Specifically, in FIG. 15, the first register REGa has a number of bits corresponding to the number of bits of the first data packet format BP1 and the bits of the first data packet format BP1 are loaded always into the first shift register REGa and possible additional bits of the second data packet format are loaded into the second shift register REGb.

Conversely, in FIG. 16, the first register REGa has a number of bits being smaller than the number of bits of the first data packet format BP1. In this case, the switching circuit selects a first input position of the second shift register REGb for the reception of further bits in accordance with the first packet data format BP1, and a second input position for the reception of further bits in accordance with the second packet data format BP2, wherein the second input position corresponds to the first input position shifted by the number of the additional bits introduced in the second data packet format BP2.

As described with respect to FIG. 14, in various embodiments, the digital processing circuit 224 receives at input configuration information, such as the one or more reference preambles PRE_CFG and/or the signal AS and/or one or more reference addresses A_CFG.

Generally, the receiver circuit 22*a* and possibly also the receiver 20 may use also further configuration information. For example, other possible configuration information includes the modulation scheme, operation frequency and/or bit rate used by the receiver 20. Moreover, also a reference data string may be provided which e.g., identifies the bit sequence for the data field DAT used to switch on the respective receiver apparatus 2.

As mentioned before, this configuration information may be fixed within the digital processing circuit 224 or may be provided to the processing circuit 224 by a further module. For example, in the embodiment shown in FIG. 14, the reference preamble PRE_CFG is provided by a memory 230, which may be a volatile memory, such as a register programmed by means of the micro-processor of the receiver apparatus, or a non-volatile memory, including also a one-time-programmable (OTP) memory.

Moreover, in many applications it may be useful that a first part of the configuration information may be fixed and a second part may be settable. For example, in various embodiments, the reference preamble and a first part (e.g., the first 8 bits) of the reference address A_CFG may be set once (e.g., by the producer of the receiver circuit 22*a*), while a second part (e.g., the remaining 8 bits) of the reference address A_CFG may be set dynamically at least in part (e.g., by the producer of the complete receiver apparatus).

Figure 19:
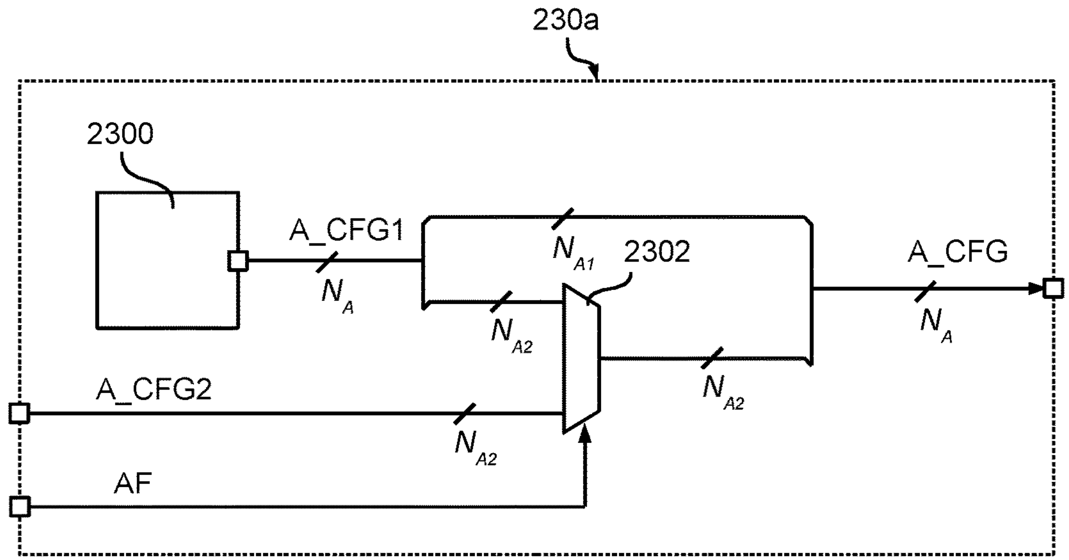
FIGS. 19 to 24 show various embodiments for setting configuration information to be used, e.g., by the receiver circuits in accordance with the present disclosure.

FIG. 19 shows in this regard an embodiment for setting, e.g., the reference address A_CFG. Specifically, in the embodiment considered, the memory 230 of FIG. 14 is replaced with a block 230*a*.

In the embodiment considered, the block 230*a* comprises a non-volatile memory, such as a Programmable Read Only Memory (PROM) 2300. For example, an one-time programmable memory may be implemented with fuses. However, also an Erasable Programmable Read Only Memory (EPROM), Electrically Erasable Programmable Read-Only Memory (EEPROM) or a flash memory may be used for the memory 2300.

In the embodiment considered, the memory 2300 provides a first reference address A_CFG1, comprising e.g., $N_A$ bit, i.e. the first reference address A_CFG1 has the same number of bits as the reference address A_CFG. Generally, the memory 2300 may also provide the signal AS and the reference preamble P_CFG (not shown in FIG. 19).

In the embodiment considered, a given number $N_{A1}$ of bits of the first reference address A_CFG1 is used directly for the reference address A_CFG, e.g., the first 8 bits [15:8] of the reference address A_CFG correspond to the first 8 bits [15:8] of the first reference address A_CFG1.

Conversely, the remaining $N_{A2}=N_A-N_{A1}$ bits of the first reference address A_CFG1 are provided to a multiplexer 2302.

In the embodiment considered, the multiplexer 2302 receives at input also a second reference address A_CFG2 having $N_{A2}$ bits.

Accordingly, the multiplexer 2302 provides at output either the $N_{A2}$ bits of the first reference address A_CFG1 or the $N_{A2}$ bits of the second reference address A_CFG2. The $N_{A2}$ bits at the output of the multiplexer 2302 are then used directly as the remaining bits of the reference address A_CFG, e.g., the remaining 8 bits [7:0] of the reference address A_CFG.

Accordingly, in the embodiment considered, a first sub-set of the bits of the reference address A_CFG (i.e., $N_{A1}$ bits) is directly provided by the memory 2300 and a second sub-set of bits of the reference address A_CFG (i.e., $N_{A2}$ bits) is provided by the multiplexer 2302, which selects between a corresponding number of bits of the first reference address A_CFG1 provided by the memory 2300 or the second reference address A_CFG2.

Specifically, in various embodiments, the selection is performed as a function of a selection signal AF, e.g.:

when the selection signal AF has a first logic value, the output of the multiplexer 2302 corresponds to the bits of the first reference address A_CFG1, and when the selection signal AF has a second logic value, the output of the multiplexer 2302 corresponds to the second reference address A_CFG2.

Figure 20:
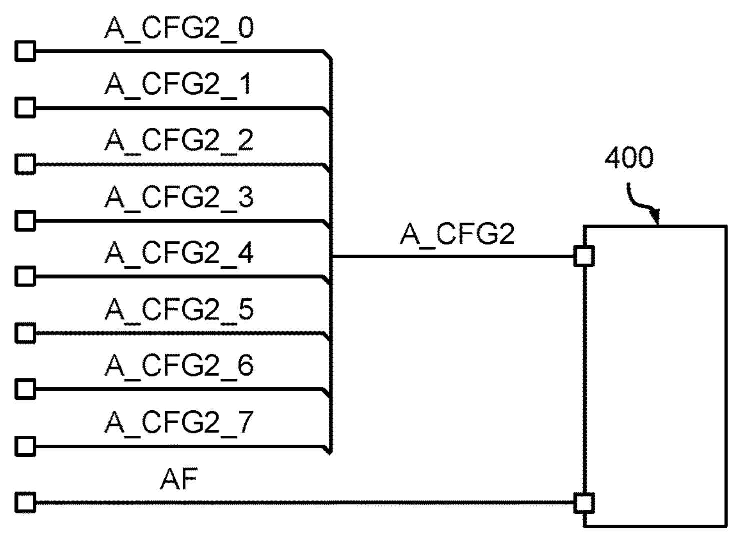

FIG. 20 shows an embodiment, wherein the second reference address A_CFG2 and the selection signal AF may be provided via the pads of the die 400 comprising the receiver circuit 22*a*. Generally, the pads of the die 400 comprising the receiver circuit 22*a* may also be connected, e.g., via wire bonding, to the pins of an integrated circuit packaging or even directly to a printed circuit boards. Generally, the second reference address A_CFG2 and the selection signal AF may be provided externally, e.g., by connecting (e.g., directly) the respective pads/pins either to ground (corresponding to a low logic level) or to a supply voltage (corresponding to a high logic level).

Specifically, in the embodiment considered, the second reference address A_CFG2 consists in $N_{A2}=8$ bits. Accordingly, a corresponding number of pads/pins A_CFG2_0 . . . A_CFG7 is required for receiving the reference address A_CFG2. Moreover, an additional pad/pin is required for receiving the signal AF. Generally, the die 400 or the respective integrated circuit may also comprise further pads/pins, e.g., for connection to ground and the supply voltage, to a debug interface, to the receiver 20 (which may also be integrated within the same integrated circuit), etc.

Accordingly, in the embodiment considered, a multiplexer 2302 is required for selecting at least part of the reference address A_CFG. For example, 8 single multiplexers would be required for the $N_{A2}=8$ bits.

Figure 21:
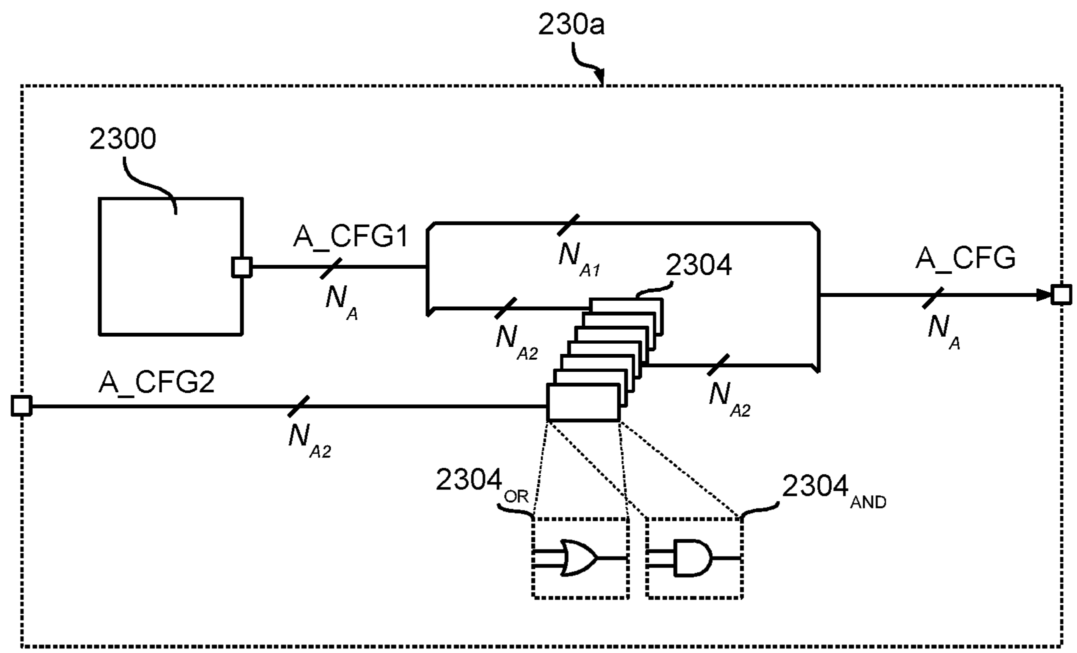

Conversely, FIG. 21 shows a modified embodiment, in which the multiplexer 2302 is replaced with a combinational logic.

Specifically, in the embodiment considered, for each of the second sub-set of $N_{A2}$ bits of the reference address A_CFG is provided a simple combinational logic 2304 comprising two inputs and one output. Accordingly, in the embodiment considered, each of the combinational logics 2304 receives at input a respective bit of the $N_{A2}$ bits of the first reference address A_CFG1 and a respective bit of the $N_{A2}$ bits of the second reference address A_CFG2 and provides at output the corresponding bit of the $N_{A2}$ bits of the reference address A_CFG. Accordingly, in the embodiment considered, the combinational logics 2304 do not receive anymore the signal AF and this signal may be omitted, i.e. the integrated circuit 400 shown in FIG. 20 does not have a pad/pin for receiving the signal AF.

For example, in various embodiments, the combinational logics 2304 may be either logic "OR" gates $\mathbf{2304}_{OR}$ or logic "AND" gates $\mathbf{2304}_{AND}$. Generally, also any other logic gate having two inputs and one output may be used for the combinational blocks 2304, such as e.g., XOR, XNOR, NAND or NOR gates.

Specifically, in case OR gates $\mathbf{2304}_{OR}$ are used, each of the $N_{A2}$ OR gates receives at input (e.g., directly) a bit of the first reference address A_CFG1 and a bit of the second reference address A_CFG2 and provides at output the corresponding bit of the reference address A_CFG by performing a logic OR operation between the respective bits of the first reference address A_CFG1 and the second reference address A_CFG2, i.e.:

$$A\_CFG[i-1]=A\_CFG1[i-1] \text{ OR } A\_CFG2[i-1],\ i=1 \ldots N_{A2}$$

Figure 22:
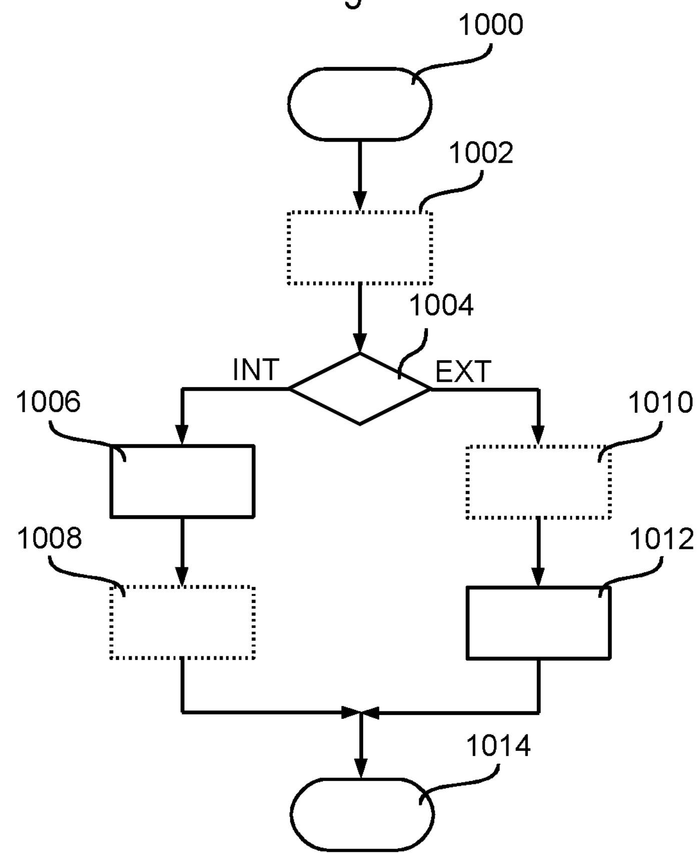

FIG. 22 shows in this respect a method for setting the reference address A_CFG.

Specifically, after a start step 1000, the method proceeds to a step 1002, in which the $N_{A1}$ bits of the internal/first reference address A_CFG1 are set, e.g., by programming the memory 2300. Generally, this step is purely optional, because these $N_{A1}$ bits may also not be used ($N_{A1}$=0) or the respective bits may be fixed by a hardware connection.

In a following step 1004, it is decided whether the $N_{A2}$ bits of the internal/first reference address A_CFG1 or the external/second reference address A_CFG2 should be used for the reference address A_CFG.

Specifically, in case the $N_{A2}$ bits of the internal/first reference address A_CFG1 should be used (output "INT" of the verification step 1004), the corresponding $N_{A2}$ bits are programmed into the memory 2300. Moreover, the $N_{A2}$ bits of the second reference address A_CFG2 are set to low in a step 1008, e.g., by connecting the respective pads/pins to ground.

Conversely, in case the $N_{A2}$ bits of the external/second reference address A_CFG2 should be used (output "EXT" of the verification step 1004), the corresponding $N_{A2}$ bits are set externally, e.g., by connecting the respective pads/pins to the supply voltage or ground. Moreover, the $N_{A2}$ bits of the first reference address A_CFG1 are set to low in a step 1012, e.g., by programming the memory 2300.

In both cases, the method terminates at a stop step 1014.

The method remains substantially the same in case AND gates are used, only the $N_{A2}$ bits of the second reference address A_CFG2 are set to high in the step 1008 and similarly the $N_{A2}$ bits of the first reference address A_CFG1 are set to high in a step 1012.

Thus, in various embodiments, the selection between AND or OR gates may be performed based on the type of the memory 2300. Specifically, in case the bits of the memory are set to low in the initial/reset condition, OR gates may be used, thereby rendering superfluous the step 1010, because the corresponding bits are already set to low. Similarly, in case the bits of the memory are set to high in the initial/reset condition, AND gates may be used, thereby again rendering superfluous the step 1010.

Moreover, the connection of the pads/pins at the step 1008 may also be implemented with internal pull-up or pull-down resistors in case the pads/pins have to be set to low or high, respectively, i.e. each of the pads/pins A_CFG2_0 . . . A_CFG2_0 shown in FIG. 20 may be connected to a pull-up or pull-down resistor. In this case, the respective pads/pins for the external/second reference address A_CFG2 may also remain disconnected and the step 1008 is purely optional.

Accordingly, in various embodiments, the producer of the integrated circuit 400 may already decide during the production process whether the customer, i.e. the producer of the apparatus 2, should have the possibility to set the external/second reference address. For example, in case only the internal/first reference address A_CFG1 should be used, the pads of the die used for receiving the second reference address A_CFG2 may also not be connected to corresponding pins of the chip package, i.e. the package may even not comprise the pins for receiving the second reference address A_CFG2.

Accordingly, the same die supports both internal and external reference addresses, and the chip producer may decide whether the customer is permitted to set the $N_{A2}$ bits of reference address A_CFG (step 1012) via an external connection at the pins of the chip package.

The embodiment of FIG. 21 has moreover the advantage that no separate pad/pin is required for the signal AF and also the dimension of the selection circuit is significant smaller. For example, a single bit multiplexer (as required for the embodiment shown in FIG. 21) usually requires at least three logic gates.

Those of skill in the art will appreciate that the same circuit may also be used to set other configuration information, such as the signal AS and/or the reference preamble PRE_CFG.

Figure 23:
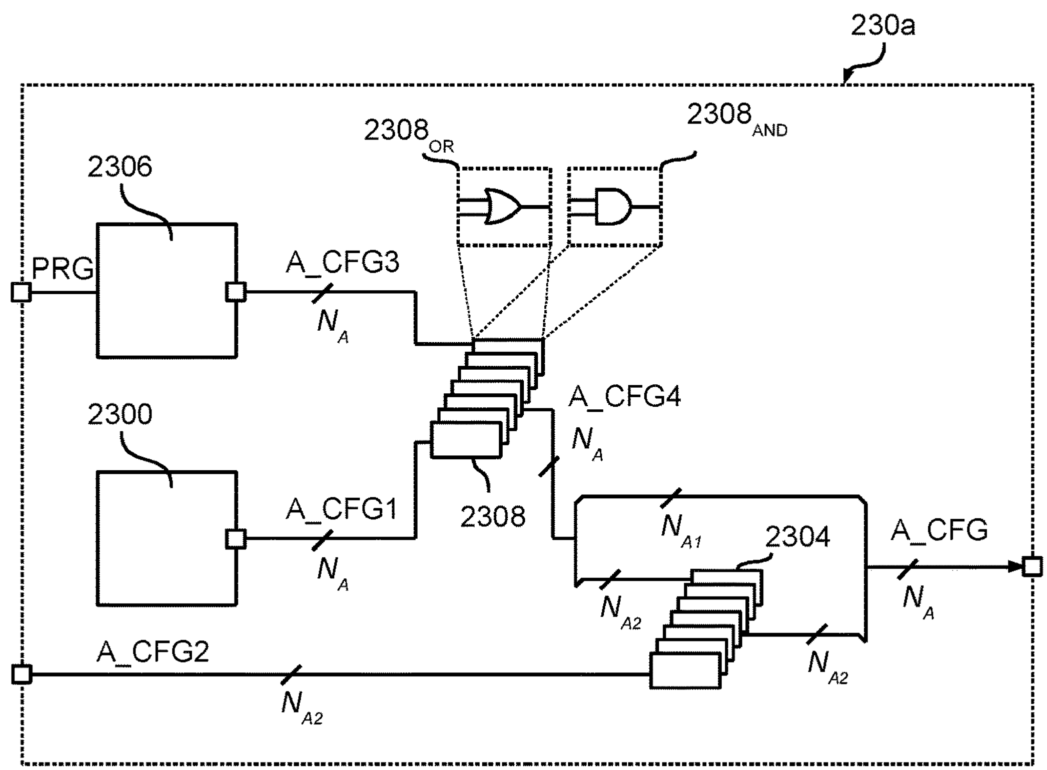

FIG. 23 shows a further embodiment of the block 230*a*.

Specifically, in the embodiment considered, the block 230*a* comprises in addition to the memory 2300 a further memory 2306 providing a further reference address A_CFG3. Generally, the memory 2306 may be either a volatile memory, such as a RAM, or a non-volatile programmable memory, such as a PROM, EPROM, EEPROM or flash memory.

For example, in various embodiments, receiver circuit 22*a* is implemented in an integrated circuit, such as a micro-controller or DSP, comprising also a digital processing unit. In this case, the memory 2306 may be a so called Special Function Register (SFR) of the processing unit and the processing unit may set the content of the memory 2306 via software instructions.

In various embodiment, the memory 2306 may be a non-volatile memory which may be programmed via a programming signal PRG provided via pads or pins of the integrated circuit. For example, in various embodiments a serial communication protocol, is used for programming the memory 2306, such as a single or two wire (unidirectional or bidirectional) communication protocol, including Serial Peripheral Interface (SPI), Inter Integrated Circuit ($I^2C$), Universal Asynchronous Receiver-Transmitter (UART), etc.

Accordingly, in the embodiment considered, the memory 2300, preferably an OTP memory, provides a first reference address A_CFG1 and the memory 2306 provides a third reference address A_CFG3. In the embodiment considered, the first reference address A_CFG1 and the third reference address A_CFG3 are provided to a further combinational logic 2308 generating a fourth reference address A_CFG4.

In various embodiments, both the first reference address A_CFG1 and the third reference address A_CFG3 have $N_A$ bits. In this case, the combinational logic 2308 comprises for each of the $N_A$ bits a logic gate, such as an OR gate $\mathbf{2308}_{OR}$ or an AND gate $\mathbf{2308}_{AND}$, having two inputs and one output. Accordingly, in the embodiment considered, each of the combinational logics 2308 receives at input a respective bit of the $N_A$ bits of the first reference address A_CFG1 and a respective bit of the $N_A$ bits of the third reference address A_CFG and provides at output the corresponding bit of the $N_A$ bits of the fourth reference address A_CFG4.

Generally, the fourth reference address A_CFG4 may directly correspond the reference address A_CFG, i.e. the combinational logic 2304 and the external pins/pads A_CFG2 may be omitted, or (as shown in FIG. 23) the fourth reference address A_CFG4 may be used in place of the first reference address A_CFG as described with respect to FIG. 21, i.e. a given number $N_{A1}$ of bits of the fourth reference address A_CFG4 is used directly for the reference address A_CFG, e.g., the first 8 bits [15:8] of the reference address A_CFG correspond to the first 8 bits [15:8] of the fourth reference address A_CFG4, and the remaining $N_{A2}=N_A-N_{A1}$ bits of the reference address A_CFG are obtained from the logic gates 2304 receiving at input respective $N_{A2}$ bits of the fourth reference address A_CFG4 and the second reference address A_CFG2.

For example, the embodiment shown in FIG. 23 permits to set a given number of bits of the reference address A_CFG, e.g., the first $N_{A1}$ bits, by programming the memory 2300 and the remaining bits of the reference address A_CFG, e.g., the remaining $N_{A2}$ bits, by either programming the memory 2306 or via an external connecting of the pads/pins providing the second reference address A_CFG2. For this reason, either the first reference address A_CFG1 or the third reference address A_CFG3 may also have less than $N_A$ bits.

Generally, the combinational circuits 2304 and 2308 may also be combined at least in part.

Figure 24:
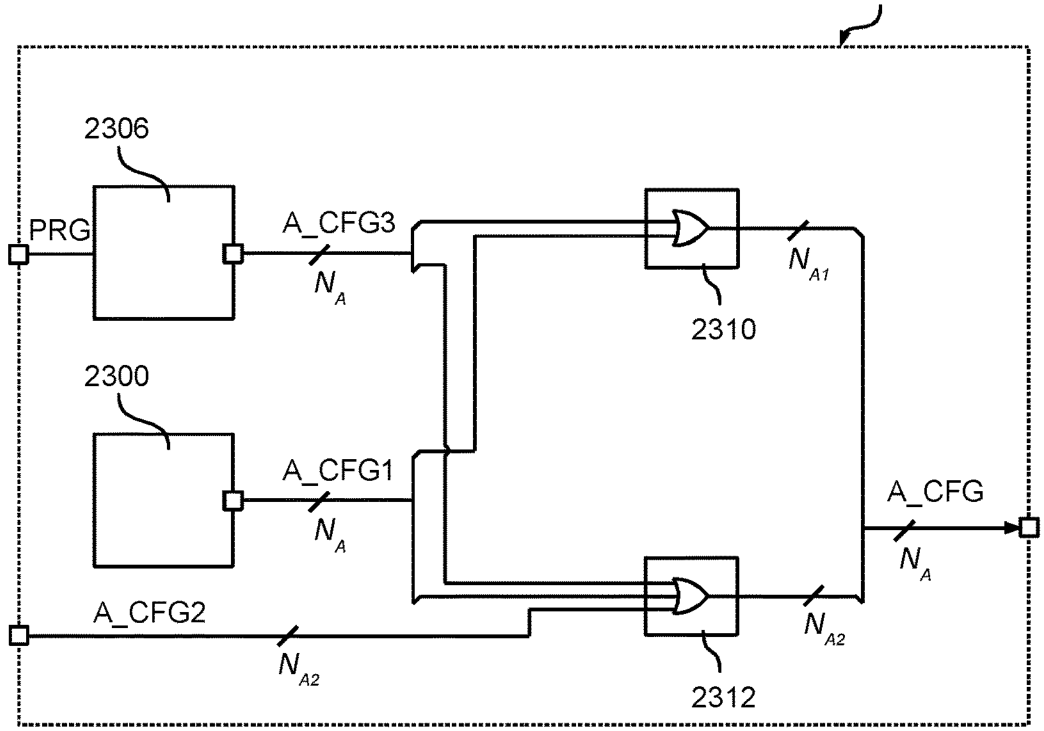

For example, FIG. 24 shows an embodiment in which the first $N_{A1}$ bits of the first reference address A_CFG1 and the third reference address A_CFG3 are provided to a set of logic gates 2310 with two inputs, i.e. each of the $N_{A1}$ logic gates 2310, such as OR or AND gates, receives at input a respective bit of the first reference address A_CFG1 and the third reference address A_CFG3, and provides at output the corresponding bit of the $N_{A1}$ bits of the reference address A_CFG. Conversely, the remaining $N_{A2}$ bits of the first reference address A_CFG1 and the third reference address A_CFG3 are provided together with the $N_{A2}$ bits of the second reference address A_CFG2 to a set of logic gates 2312 with three inputs, i.e. each of the $N_{A2}$ logic gates 2312, such as OR or AND gates, receives at input a respective bit of the first reference address A_CFG1, the second reference address A_CFG2 and the third reference address A_CFG3, and provides at output the corresponding bit of the $N_{A2}$ bits of the reference address A_CFG.

Accordingly, in the embodiment described in the foregoing, the integrated circuit 400 comprises a circuit 230*a* configured to provide at output a given number $N_{A2}$ of bits of configuration information to be used by another circuit of the integrated circuit 400, such as the $N_{A2}$ bits of the reference address A_CFG.

For this purpose, the integrated circuit 400 comprises one or more pads receiving a first group of $N_{A2}$ bits, e.g., the second reference address A_CFG2, and a non-volatile programmable memory for generating a second group of $N_{A2}$ bits, such as the memories 2300. Generally, the first group of $N_{A2}$ bits may also be provided by a second memory, e.g., the memory 2306 providing the third reference address A_CFG3.

The block 230*a* comprises moreover, for each of the $N_{A2}$ bits a logic gate, such as the gates 2304 or the gates 2312, receiving at input a respective bit of the first group of $N_{A2}$ bits and a respective bit of the second group of $N_{A2}$ bits, and providing at output a corresponding bit of the $N_{A2}$ bits of configuration information. Accordingly, in the embodiment considered, a first input terminal of each logic gate is connected (e.g., directly) to a respective bit of the output of the non-volatile programmable memory and second input terminal of each logic gate is connected (e.g., directly) to a pad of the integrated circuit or a respective bit of the output of the second memory. Generally, in case the second input terminal of each logic gate is connected (e.g., directly) to a pad of the integrated circuit, a third input terminal of each logic gate may be connected (e.g., directly) to a respective bit of the output of the second memory.

Specifically, in various embodiments, the logic gate is selected such that the output of the logic gate is not imposed to a fixed value when the respective bit stored in the non-volatile programmable memory is set to its unprogrammed/erased value. For example, in case the unprogrammed/erased value corresponds to a low logic value, an OR, NOR, XOR, or XNOR gate may be used. Conversely, in case the unprogrammed/erased value corresponds to a high logic value, an AND, NAND, XOR, or XNOR gate may be used.

In various embodiments, additional $N_{A1}$ bits of configuration information may be provided by the non-volatile programmable memory and/or the second memory.

The main advantage of the solutions described in the foregoing resides in the possibility of implementing a further feature of external programming (e.g., in parallel via the pads or serially by programming the memory 2306 via the pad(s) PRG) but minimizing area and power of the internal microarchitecture of the IC. A further and not negligible advantage is the reduction of pin utilization.

The proposed solutions are very flexible. For example, the solutions work with different address/data sources. The solutions may be applied to the complete or subsets of address/data bits. The solutions work with erased memories filled with zero values (e.g., by using OR gates) or one values (e.g., by using AND gates), thereby not requiring a mandatory programming phase of the memory 2300. The external data/address may also be provided through a serial port transmission mode rather than a parallel port.

Of course, without prejudice to the principle of the invention, the details of construction and the embodiments may vary widely with respect to what has been described and illustrated herein purely by way of example, without thereby departing from the scope of the present invention, as defined by the ensuing claims. For example, the circuits 230*a* described in the foregoing may also be used in other systems in order to provide at output a given number of bits of configuration information to be used by a processing circuit.

What is claimed is:

1. A system comprising:

a processing circuit comprising a shift register configured to receive data bits, the processing circuit also comprising a verification circuit; and a circuit configured to output a given number N of bits of configuration information to be used by the processing circuit, wherein the circuit comprises:

a non-volatile programmable memory configured to output a first group of N bits;

N terminals for receiving a second group of N bits; and

N logic gates, wherein a first input terminal of each logic gate of the N logic gates is connected to a respective bit of an output of the non-volatile programmable memory, wherein a second input terminal of each logic gate is connected to a respective terminal of the N terminals, and wherein the verification circuit is configured to perform a bit level comparison between a first set of bits of the received data bits of the shift register and the given number N of bits of configuration information and generate a result signal based on the bit level comparison.

2. The system according to claim 1, wherein the N logic gates are configured to output the N bits of configuration information, wherein the first input terminal of each logic gate is connected directly to a respective bit of the output of the non-volatile programmable memory to receive the first group of N bits, and the second input terminal of each logic gate is connected directly to a respective terminal of the N terminals to receive the second group of N bits.

3. The system according to claim 1, further comprising a further memory configured to output a third group of N bits, each of the N bits of the further memory being coupled to a second input terminal of a respective one of the N logic gates via a respective one of the N terminals.

4. The system according to claim 3, wherein the N logic gates are configured to output the N bits of configuration information, wherein the first input terminal of each logic gate is connected directly to a respective bit of the output of the non-volatile programmable memory to receive the first group of N bits, and the second input terminal of each logic gate is connected directly to a respective bit of the output of the further memory to receive the third group of N bits, wherein the second group of N bits is the third group of N bits.

5. The system according to claim 3, wherein the N logic gates are configured to output the N bits of configuration information, wherein the first input terminal of each logic gate is connected directly to a respective bit of the output of the non-volatile programmable memory to receive the first group of N bits, the second input terminal of each logic gate is connected directly to a respective terminal of the N terminals to receive the second group of N bits and a third input terminal of each logic gate is connected directly to a respective bit of the output of the further memory to receive the third group of N bits.

6. The system according to claim 3, wherein the first input terminal of each logic gate is connected directly to a respective bit of the output of the non-volatile programmable memory to receive the first group of N bits;

wherein the second input terminal of each logic gate is connected directly to a respective bit of the output of the further memory to receive the third group of N bits;

wherein the circuit further comprises N further logic gates configured to output the N bits of configuration information; and wherein a first input terminal of each further logic gate is connected directly to the output of a respective logic gate and a second input terminal of each further logic gate is connected directly to a respective terminal of the N terminals to receive the second group of N bits.

7. The system according to claim 1, wherein the non-volatile programmable memory is configured to output M bits of configuration information, M being different than N.

8. The system according to claim 1, wherein the processing circuit is configured to detect a reference address in the received data bits, wherein the received data bits are received in a serial data signal and wherein the configuration information includes the reference address.

9. The system according to claim 8, wherein the reference address comprises L bits, and wherein L is a positive integer based on a first signal.

10. The system according to claim 9, wherein the shift register comprises a first shift register and a second shift register, and wherein the second shift register begins to shift data in after the first shift register is fully loaded.

11. The system according to claim 9, wherein the data bits received by the shift register comprises P bits, and wherein P is a positive integer based on the first signal.

12. The system according to claim 9, wherein the first signal is based on the received data bits.

13. The system according to claim 1, wherein unprogrammed/erased bits in the non-volatile programmable memory are set to a low logic value and the N logic gates are OR, NOR, XOR or XNOR gates.

14. The system according to claim 1, wherein unprogrammed/erased bits in the non-volatile programmable memory are set to a high logic value and the N logic gates are AND, NAND, XOR or XNOR gates.

15. The system according to claim 1, wherein the system is part of an integrated circuit comprising N pads connected to the N terminals so that the second group of N bits can be received from a source external to the integrated circuit.

16. A method comprising:

receiving a first group of N bits from a non-volatile programmable memory, wherein N is a real number;

receiving a second group of N bits from a source, the source comprising a second non-volatile programmable memory or a set of N terminals configured to receive the second group of N bits from an external source;

performing a logic operation on the first group of N bits and the second group of N bits, a result of the logic operation comprising N bits of configuration information;

receiving Q data bits, wherein Q is a positive integer;

shifting into a shift register the Q data bits;

comparing a first set of bits of the Q data bits with the N bits of configuration information; and generating a result signal based on the comparison.

17. The method according to claim 16, wherein the source comprises the second non-volatile programmable memory.

18. The method according to claim 16, wherein the source comprises the set of N terminals configured to receive the second group of N bits from the external source.

19. The method according to claim 18, further comprising receiving a third group of N bits from a second non-volatile programmable memory, wherein performing the logic operation comprises performing a logic operation on the first group of N bits, the second group of N bits and the third group of N bits.

20. The method according to claim 16, wherein unprogrammed/erased bits in the non-volatile programmable memory are set to a low logic value and the logic operation comprises an OR, NOR, XOR or XNOR logic operation.

21. The method according to claim 16, wherein unprogrammed/erased bits in the non-volatile programmable memory are set to a high logic value and the logic operation comprises an AND, NAND, XOR or XNOR logic operation.

22. A method comprising:

receiving a first group of N bits from a first source, wherein N is a real number;

receiving a second group of N bits from a second source, wherein one of the first and second groups of N bits comprises a configuration information and all N bits of the other of the first and second groups of N bits are set to a common logic value;

performing a logic operation on the first group of N bits and the second group of N bits, a result of the logic operation comprising the N bits configuration information;

receiving Q data bits, wherein Q is a positive integer based on a first signal;

shifting into a shift register the Q data bits;

comparing a first set of bits of the Q data bits with the N bits of configuration information; and generating a result signal based on the comparison.

23. The method according to claim 22, wherein the first source comprises a non-volatile programmable memory on an integrated circuit substrate and the second source comprises N terminals coupled to a source external to the integrated circuit substrate.

24. The method according to claim 22, wherein the first source comprises a first non-volatile programmable memory and the second source comprises a second non-volatile programmable memory.

25. The method according to claim 22, wherein all N bits of the other of the first and second groups of N bits are set to a low logic value and the logic operation comprises an OR, NOR, XOR or XNOR logic operation.

* * * * *